United States Patent [19]

Tsujihashi et al.

[11] Patent Number: 5,384,734
[45] Date of Patent: Jan. 24, 1995

[54] MULTIPORT MEMORY DEVICE AND AN OPERATION METHOD THEREOF

[75] Inventors: Kumiko Tsujihashi; Yoshiki Tsujihashi; Hirofumi Shinohara, all of Hyogo, Japan

[73] Assignee: Mitsubishi Denki Kabushiki Kaisha, Tokyo, Japan

[21] Appl. No.: 956,137

[22] Filed: Oct. 2, 1992

[30] Foreign Application Priority Data

Mar. 17, 1992 [JP] Japan .................................. 4-060673

[51] Int. Cl.$^6$ .............................................. G11C 7/00
[52] U.S. Cl. ................... 365/189.04; 365/195; 365/230.05
[58] Field of Search ............... 365/189.04, 195, 230.05

[56] References Cited

U.S. PATENT DOCUMENTS

| | | | |
|---|---|---|---|
| 4,554,645 | 11/1985 | Furman | 365/189.04 |
| 4,742,487 | 5/1988 | Bernstein | 365/195 |
| 5,036,491 | 7/1991 | Yamaguchi | 365/230.05 |
| 5,073,873 | 12/1991 | Nogami | 365/230.08 |

FOREIGN PATENT DOCUMENTS

| | | |
|---|---|---|
| 272869 | 6/1988 | European Pat. Off. . |
| 62-175993 | 8/1987 | Japan . |
| 63-201986 | 8/1988 | Japan . |
| 1-303694 | 12/1989 | Japan . |
| 2-230444 | 9/1990 | Japan . |

OTHER PUBLICATIONS

Bliklen, "Speicherkonfigurationen mit Dual-Port SRAMs", *Design & Elektronik*, 12th issue, Jun. 9, 1987, 99. 106, 108.

*Primary Examiner*—Eugene R. LaRoche
*Assistant Examiner*—F. Niranjan
*Attorney, Agent, or Firm*—Lowe, Price, LeBlanc & Becker

[57] ABSTRACT

Memory cell array includes a plurality of 2-port memory cells. A first row address decoder for decoding a first address signal to select a first word line included in any one of a plurality of word line groups, and a second row address decoder for decoding a second address signal to select a second word line included in any one of a plurality of word line groups are provided. A word line driving circuit receives output signals of first and second row address decoders to drive first and second word lines in accordance with a predetermined inhibit condition.

9 Claims, 20 Drawing Sheets

FIG. 5

| | FIRST PORT | SECOND PORT | OPERATION |
|---|---|---|---|
| CASE 1 | READ WE1="L" | READ WE2="L" | BOTH PERMITTED |
| CASE 2 | WRITE WE1="H" | READ WE2="L" | ONE PERMITTED THE OTHER INHIBITED |
| CASE 3 | READ WE1="L" | WRITE WE2="H" | ONE PERMITTED THE OTHER INHIBITED |
| CASE 4 | WRITE WE1="H" | WRITE WE2="H" | ONE PERMITTED THE OTHER INHIBITED |

FIG. 8

| | FIRST PORT | SECOND PORT | OPERATION |
|---|---|---|---|
| CASE 1 | READ WE1="L" | READ WE2="L" | BOTH PERMITTED |
| CASE 2 | WRITE WE1="H" | READ WE2="L" | BOTH PERMITTED |
| CASE 3 | READ WE1="L" | WRITE WE2="H" | BOTH PERMITTED |
| CASE 4 | WRITE WE1="H" | WRITE WE2="H" | ONE PERMITTED THE OTHER INHIBITED |

F I G. 1 7 PRIOR ART

MULTIPORT MEMORY DEVICE AND AN OPERATION METHOD THEREOF

BACKGROUND OF THE INVENTION

1. Field of the Invention

The present invention relates to multiport memory devices, and more particularly, to an improvement of operation when accesses to the same memory cell are in contention.

2. Description of the Background Art

A multiport memory is a memory having a plurality of ports, and is, used for example, as a register file contained in a microprocessor and the like. A port here is a series of circuits which operates with an address signal.

(The First Prior Art)

FIG. 16 is a schematic diagram of a circuit showing an example of a conventional multiport memory. The multiport memory of this type is disclosed in Japanese Patent Laying-Open No. 63-201986.

Referring to FIG. 16, a memory cell array includes a plurality of 2-port memory cells disposed in an array of a plurality of rows and a plurality of columns. In FIG. 16, only one memory cell MC0 is shown. A plurality of first and second word lines WL1, WL2 are arranged corresponding to a plurality of rows of the memory cell, while a plurality of first and second bit lines BL1, BL2 are arranged corresponding to a plurality of columns of the memory cell. A memory cell MC is connected to corresponding first and second word lines WL1, WL2 and corresponding first and second bit lines BL1, BL2.

A first address decoder 21 decodes an externally applied first signal A1 to select one of a plurality of first word lines WL1. A first word line driving circuit 31 drives the selected first word line WL1 in response to an output of the first address decoder 21. A second address decoder 22 selects one of a plurality of second word lines WL2 in response to an externally applied second address signal A2. A second word line driving circuit 32 drives the selected second word line WL2 in response to an output of the second address decoder 22.

Data is read from a plurality of memory cells MC connected to the driven first word line WL1 to the respective corresponding first bit line BL1. Data is also read from a plurality of memory cells MC connected to the driven second word line WL2 to the respective corresponding second bit line BL2.

In the read operation, a sense amplifier 5 amplifies data on a plurality of first bit lines BL1 and data on a plurality of second bit lines BL2 to provide those data to first and second data buses D1, D2.

A write driver & write control circuit 6 provides, in the write operation, data on first and second data buses D1, D2 to a plurality of first and second bit lines BL1, BL2, respectively. A bit line precharge circuit 7 precharges first and second bit lines BL1, BL2.

An operation control circuit 8 receives first and second reference clocks $\phi 1$, $\phi 2$, a chip selecting signal CS, and first and second read/write signals RW1, RW2 to generate precharge signals P1, P2, P3, first and second sense enable signals SE1, SE2, and first and second write enable signals WE1, WE2.

The precharge signals P1, P2, P3 are applied to the bit line precharge circuit 7. The first and second sense enable signal SE1, SE2 are applied to the sense amplifier 5. The first and second write enable signals WE1, WE2 are applied to the first word line driving circuit 31, the second word line driving circuit 32, and the write driver & write control circuit 6.

The chip selecting signal CS is a control signal for selecting between a selected state and a non-selected state of the multiport memory. The first read/write signal RW1 is a control signal for selecting a read state or a write state with regard to a first port, while the second read/write signal RW2 is a control signal for selecting a read state or a write state with regard to a second port.

The precharge signal P1 is a control signal for precharging the first bit line BL1, the precharge signal P2 is a control signal for precharging the second bit line BL2, and the precharge signal P3 is a control signal for equalizing potentials of the first and second bit lines BL1, BL2 in order to precharge the first and second bit lines BL1, BL2 at high speed.

The first sense enable signal SE1 is a signal for activating a sense operation of data on the first bit line BL1. The second sense enable signal SE2 is a signal for activating a sense operation of data on the second bit line BL2. The first write enable signal WE1 is a control signal for setting the first port to a write state or a read state. The second write enable signal WE2 is a control signal for setting the second port to the write state or the read state.

When the first write enable signal WE1 is at a logic high or "H" level and at a logic low or "L" level, the first port is set to the write state and the read state, respectively. When the second write enable signal WE2 is at "H" and at "L", the second port is set to the write state and the read state, respectively.

The write driver & write control circuit 6 transfers data on the first data bus D1 to the first and second bit lines BL1, BL2 as write data when the first write enable signal WE1 is at "H". The write driver & write control circuit 6 also transfers data on the second data bus D2 to the first and second bit lines BL1, BL2 as write data when the second write enable signal WE2 is at "H". When the first and second write enable signals WE1, WE2 are at "L", the write driver & write control circuit 6 attains a high impedance state.

FIG. 17 is a schematic diagram of a circuit showing a configuration of a 2-port memory cell MC0.

The memory cell MC0 includes inverters G1, G2 and first and second access gates T1, T2 configured of N channel MOS transistors. The input terminal of the inverter G1 and the output terminal of the inverter G2 are connected to a storage node Q1. The output terminal of the inverter G1 and the input terminal of the inverter G2 are connected to a storage node Q2, thereby configuring a storage retaining circuit.

The first access gate T1, connected between the storage node Q1 and the first bit line BL1, receives a potential of the first word line WL1 to be rendered conductive or non-conductive. The second access gate T2, connected between the storage node Q2 and the second bit line BL2, receives a potential of the second word line WL2 to be rendered conductive or non-conductive.

The inverters G1, G2 configure a flip-flop, and data complementary to each other are stored in the storage nodes Q1, Q2.

If the first word line WL1 is selected in the read operation, the first access gate T1 is turned on to cause data retained in the storage node Q1 to be transferred to the first bit line BL1. The data is provided to the first data bus D1 through the sense amplifier 5 shown in FIG. 16. If the second word line WL2 is selected, the second access gate T2 is turned on to cause data retained in the storage node Q2 to be transferred to the second bit line BL2. The data is provided to the second data bus D2 through the sense amplifier 5 shown in FIG. 16.

Both first and second bit lines BL1, BL2 are used in the write operation. Data on the first or second data buses D1, D2 shown in FIG. 16 are provided to the first and second bit lines BL1, BL2 through the write driver & write control circuit 6. Write data and inverted data of the write data are provided to the first bit line BL1 and the second bit line BL2, respectively. If the first and second word lines WL1, WL2 are selected, the first and second access gates T1, T2 are turned on, the write data on the first bit line BL1 is written in the storage node Q1, and the inverted data on the second bit line BL2 is written in the storage node Q2.

FIG. 18 is a schematic diagram of a circuit showing an example of configuration of first and second address decoders 21, 22 and first and second word line driving circuits 31, 32. In FIG. 18, only a portion corresponding to a set of the first and second word lines WL1, WL2 is shown.

An NAND gate G21 and an NAND gate G22 are included in the first address decoder 21 and the second address decoder 22, respectively. Tristate buffers G31a, G31b and a control signal generating circuit 81 are included in the first word line driving circuit 31. Tristate buffers G32a, G32b and a control signal generating circuit 82 are included in the second word line driving circuit 32.

Each bit of the first address signal A1 or an inverted signal thereof is provided to each input terminal of the NAND gate G21. When an output of the NAND gate G21 attains "L", the first and second word lines WL1, WL2 are selected. Each bit of the second address signal A2 or an inverted signal thereof is provided to each input terminal of the NAND gate G22. When an output of the NAND gate G22 attains "L", the first and second word lines WL1, WL2 are selected.

The tristate buffer G31a is activated in the read operation or the write operation with regard to the first port. The tristate buffer G31b is activated only in the write operation with regard to the first port. The tristate buffer G32a is activated in the read operation or the write operation with regard to the second port. The tristate buffer G32b is activated only in the write operation with regard to the second port.

The control signal generating circuit 81 controls the tristate buffers G31a, G31b in response to the first and second write enable signals WE1, WE2. The control signal generating circuit 82 controls the tristate buffers G32a, G32b in response to the first and second write enable signals WE1, WE2.

If the first write enable signal WE1 is at "L" (the first port is at the read state), the tristate buffer G31a drives the first word line WL1 to "H" to cause an output of the tristate buffer G31b to attain a high impedance state. If the second write enable signal WE2 is at "L" (the second port is at the read state), the tristate buffer G32a drives the second word line WL2 to "H" to cause an output of the tristate buffer G32b to attain a high impedance state.

If the first write enable signal WE1 is at "H" (the first port is at the write state), the first and second word lines WL1, WL2 are driven to "H" by the tristate buffers G31a, G31b, respectively. At that time, the outputs of the tristate buffers G32a, G32b both attain the high impedance states in order to inhibit a selecting operation in the second port.

If the second write enable signal WE2 is at "H" (the second port is at the write state), the second and first word lines WL2, WL1 are driven to "H" by the tristate buffers G32a, G32b, respectively. At that time, the outputs of the tristate buffers G31a, G31b both attain the high impedance states in order to inhibit a selecting operation in the first port.

(The Second Prior Art)

FIG. 19 is a block diagram showing another example of a conventional multiport memory. The multiport memory of this type is disclosed in Japanese Patent Laying-Open No. 62-175993.

Referring to FIG. 19, a memory cell array 10 includes a plurality of 2-port memory cells disposed in a matrix of a plurality of rows and a plurality of columns. A first row address decoder 21 selects any one of a plurality of rows in the memory cell array 10 in response to a first row address signal A1r. A second row address decoder 22 selects any one of a plurality of rows in the memory cell array 10 in response to a second row address signal A2r. A first column address decoder 41 selects any one of a plurality of columns in the memory cell array 10 in response to a first column address signal A1c. A second column address decoder 42 selects any one of a plurality of columns in the memory cell array 10 in response to a second column address signal A2c.

A first input/output circuit 91 reads data to the first data bus D1 from a memory cell selected by the first row address decoder 21 and the first column address decoder 41, or writes data on the first data bus D1 in a memory cell selected by the first row address decoder 21 and the first column address decoder 41, in response to a read/write signal RW1.

A second input/output circuit 92 reads data to the second data bus D2 from a memory cell selected by the second row address decoder 22 and the second column address decoder 42, or writes data on the second data bus D2 in a memory cell selected by the second row address decoder 22 and the second column address decoder 42, in response to a read/write signal RW2.

A BUSY circuit 100 generates first and second busy signals BUSY1, BUSY2 in response to the first and second row address signals A1r, A2r, the first and second column address signals A1c, A2c, and the first and second read/write signals RW1, RW2.

The first row address signal A1r and the first column address signal A1c configure a first address signal A1 corresponding to the first port, and the second row address signal A2r and the second column address signal A2c configure a second address signal A2 corresponding to the second port.

FIG. 20 is a diagram showing a configuration of a 2-port memory cell. The memory cell MC1 of this type is a flip-flop type static memory cell.

The memory cell MC1 includes a flip-flop circuit FF, first access gates T1a, T1b configured of an N channel MOS transistor, and second access gates T2a, T2b configured of an N channel MOS transistor.

The memory cell MC1 is connected to the first word line WL1 corresponding to the first port, the second word line WL2 corresponding to the second port, the first bit lines BL1a, BL1b corresponding to the first port, and the second bit lines BL2a, BL2b corresponding to the second port.

The first access gate T1a, is connected between the flip-flop circuit FF and the first bit line BL1a to be rendered conductive or non-conductive in response to potential of the first word line WL1. The first access gate T1b is connected between the flip-flop circuit FF and the first bit line Bl1b to be rendered conductive or non-conductive in response to the potential of the first word line WL1. The second access gate T2a is connected between the flip-flop circuit FF and the second bit line BL2a to be rendered conductive or non-conductive in response to the potential of the second word line WL2. The second access gate T2b is connected between the flip-flop circuit FF and the second bit line BL2b to be rendered conductive or non-conductive in response to the potential of the second word line WL2.

Data complementary to each other are provided to the first bit lines BL1a, BL1b. Similarly, data complementary to each other are also provided to the second bit lines BL2a, BL2b. The first and second word lines WL1, WL2 configure a group of word lines. The first and second bit lines BL1a, BL1b, BL2a, BL2b also configure a group of bit lines.

The first row address decoder 21 shown in FIG. 19 decodes the first row address signal A1r to select the first word line WL1 included in any one of a plurality of word line groups. The first column address decoder 41 decodes the first column address signal A1c to select a set of first bit lines BL1a, BL1b included in any one of a plurality of bit line groups.

The second row address decoder 22 decodes the second row address signal A2r to select the second word line WL2 included in any one of a plurality of word line groups. The second column address decoder 42 decodes the second column address signal A2c to select a set of second bit lines BL2a, BL2b included in any one of a plurality of bit line groups.

Referring to FIG. 20, when the first word line WL1 is selected, the first access gates T1a, T1b are turned on to cause data and an inverted data thereof retained in the flip-flop circuit FF to be read to the first bit lines BL1a, BL1b, respectively, or data and an inverted data thereof on the first bit lines BL1a, BL1b to be written in the flip-flop circuit FF. When the second word line WL2 is selected, the second access gates T2a, T2b are turned on to cause data and an inverted data thereof retained in the flip-flop circuit FF to be read to the second bit lines BL2a, BL2b, respectively, or data or an inverted data thereof on the second bit lines BL2a, BL2b to be written in the flip-flop circuit FF.

Since it is possible to select the first word line WL1 corresponding to the first port and the second word line WL2 corresponding to the second port independently, data can be written in any memory cell from a bit line corresponding to each port independently, or data stored in any memory cell can be read to a bit line corresponding to each port independently.

FIG. 21 is a schematic diagram of a circuit showing a configuration of one part of the BUSY circuit 21. In FIG. 21, only a signal generating circuit for generating the second busy signal BUSY2 is shown.

The signal generating circuit includes a plurality of 2-input exclusive OR circuits G91 and OR circuits G92, G93. Each of the exclusive OR circuits G91 has one input terminal provided with each bit A1 (i) of the first address signal A1, and the other input terminal provided with each bit A2 (i) of the second address signal A2, where i is any integer of 0 to n.

Outputs of the plurality of exclusive OR circuits G91 are provided to the OR circuit G92. The output of the OR circuit G92 is provided to one input terminal of the OR circuit G93. The first read/write signal RW1 is applied to the other input terminal of the OR circuit G93. The second busy signal BUSY2 is provided from the OR circuit G93.

The plurality of exclusive OR circuits G91 and the OR circuit G92 configure an address match/mismatch detecting circuit.

A signal generating circuit for generating the first busy signal BUSY1 also includes an address match/mismatch detecting circuit configured of the plurality of exclusive OR circuits G91 and the OR circuit G92, and the OR circuit G93 for generating the first busy signal BUSY1, as well as a signal generating circuit shown in FIG. 21, but the second read/write signal RW2 is applied to the other input terminal of the OR circuit G93.

The first busy signal BUSY1 is a stop signal for indicating stop of the write operation or the read operation in the first port. The second busy signal BUSY2 is a stop signal for indicating stop of the write operation or the read operation in the second port.

When the first address signal A1 corresponding to the first port and the second address signal A2 corresponding to the second port express exactly the same address, the output of the OR circuit G92 attains "L". At that time, if the first read/write signal RW1 is at "L" (the first port is at the write state), the second busy signal BUSY2 attains "L" in order to avoid writing data in the same memory cell. An external CPU stops access to the second port in response to the second busy signal BUSY2.

Similarly, if the second read/write signal RW2 is at "L" (the second port is at the write state), the first busy signal BUSY1 attains "L" in order to avoid writing data in the same memory cell. The external CPU stops access to the first port in response to the first busy signal BUSY1.

In a multiport memory shown in FIG. 16, since both first and second bit lines BL1, BL2 are used in the write operation, the write operation cannot be carried out in two ports simultaneously. In this case, after the write operation of the port which is accessed earlier is completed, the write operation of the port which is accessed later is carried out. Therefore, it is not possible to write data in the same memory cell from two ports simultaneously. As a result, data stored in the memory cell is protected.

However, when the write operation is being carried out in one port, it is not also possible to carry out the read operation in the other port. It is therefore necessary to carry out the read operation in one port after completion of the write operation in the other, which poses a problem of slow access speed.

In a conventional multiport memory shown in FIG. 19, it is possible to carry out the write operation or the read operation in two ports simultaneously. However, when data is written in the same memory cell from two ports simultaneously, data stored in the memory cell is destroyed.

It is therefore necessary to inform an external circuit such as CPU that when the write of data in a certain memory cell in one port is being carried out, the write of data in the same memory cell in the other port is inhibited, and provision of the BUSY circuit 100 is required for that purpose. As a result, circuits and interconnection are increased.

SUMMARY OF THE INVENTION

One object of the present invention is to provide a multiport memory device which enables as much as possible simultaneous accesses to the same memory cell while protecting data stored in the memory cell without increasing interconnection and circuits.

Another object of the present invention is to enhance access speed of a multiport memory device.

Still another object of the present invention is to enhance access speed while preventing destruction of data stored in a memory cell of a multiport memory device.

The multiport memory device according to the present invention is provided with a plurality of memory cells for storing data, a plurality of access circuits for each accessing any one of the plurality of memory cells independently, and an inhibit circuit for inhibiting simultaneous accesses to the same memory cell by at least two access circuits in accordance with a predetermined inhibit condition when accesses to the same memory cell by at least two access circuits are in contention.

The inhibit circuit may include a signal generating circuit for generating an inhibit state setting signal in accordance with a predetermined inhibit condition, and a control circuit for inhibiting simultaneous accesses to the same memory cell in response to the inhibit state setting signal when accesses to the same memory cell by at least two access circuits are in contention.

The predetermined inhibit condition may be the simultaneous write of data to the same memory cell by at least two access circuits.

The predetermined inhibit condition may be the simultaneous write of data in the same memory cell by at least two access circuits, and the simultaneous write and read of data in and from the same memory cell by at least two access circuits.

In the multiport memory device, when accesses to the same memory cell by at least two access circuits are in contention, simultaneous accesses to the same memory cell are inhibited in accordance with the predetermined inhibit condition. When the predetermined inhibit condition is not satisfied, simultaneous accesses to the same memory cell by at least two access circuits are permitted.

Therefore, it is possible to access simultaneously to the same memory cell when data stored in the memory cell is protected and the inhibit condition is not satisfied.

Briefly, only when the predetermined inhibit condition is satisfied, simultaneous accesses to the same memory cell by a plurality of access circuits are inhibited. In the cases other than that, simultaneous accesses to the same memory cell by a plurality of access circuits are permitted. Therefore, memory access of as high degree of freedom as possible can be made possible while protecting data stored in the memory cell without increasing interconnection and control circuits.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a representation for summarizing operations of the word line driving circuit of FIG. 3.

FIG. 8 is a representation for summarizing operations of the word line driving circuit of FIG. 6.

DESCRIPTION OF THE PREFERRED EMBODIMENTS (A First Embodiment)

Figure 1:
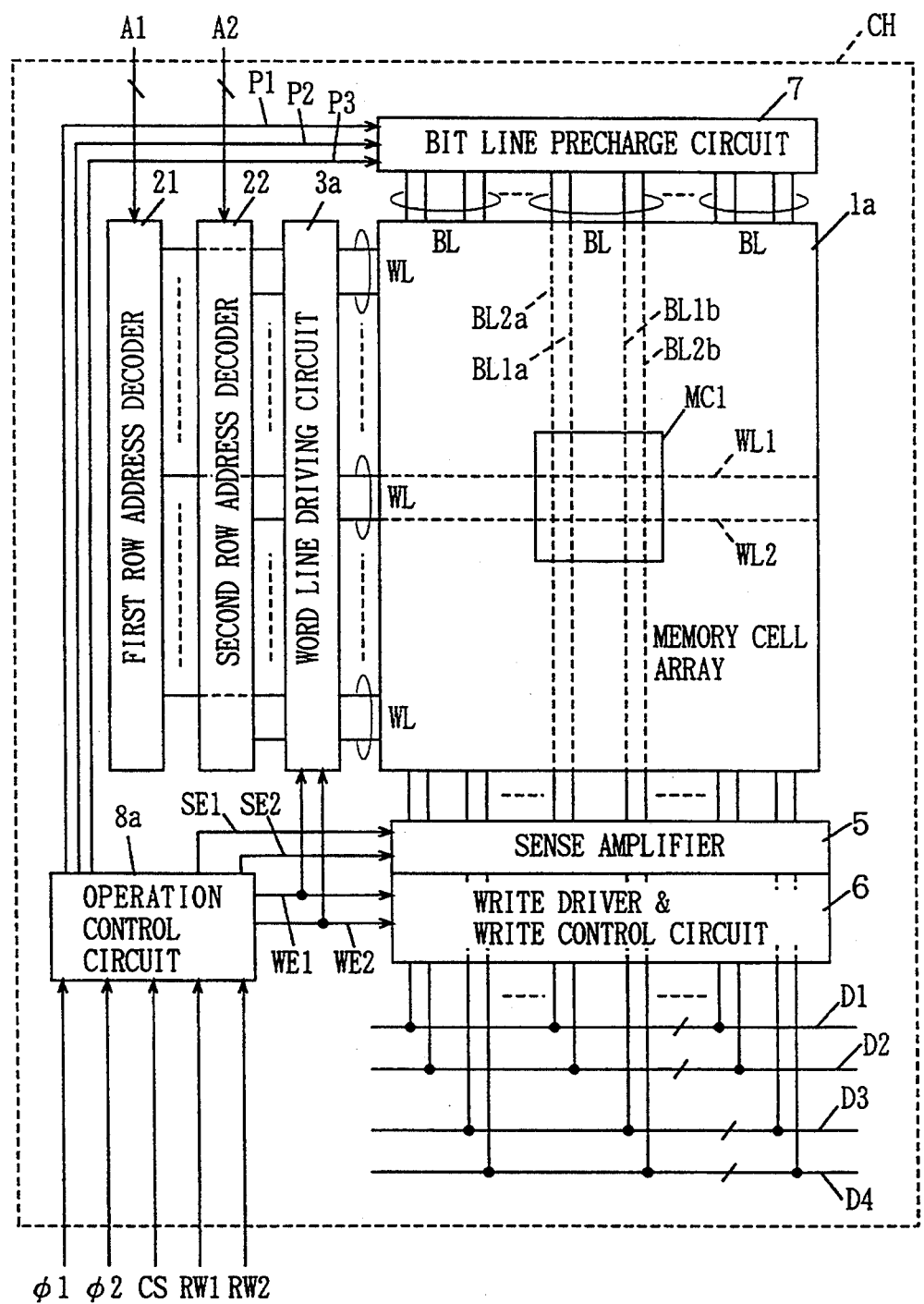
FIG. 1 is a block diagram showing a configuration of a multiport memory according to a first embodiment of the present invention.

FIG. 1 is a block diagram showing a configuration of a multiport memory according to a first embodiment of the present invention. The multiport memory of FIG. 1 is formed on a single chip CH.

A memory cell array 1a includes a plurality of 2-port memory cells disposed in an array of a plurality of rows and a plurality of columns. In FIG. 1, one memory cell MC1 is shown.

A plurality of word line groups WL are arranged corresponding to a plurality of rows in the memory cell array 1a, and a plurality of bit line groups BL are arranged corresponding to a plurality of columns in the memory cell array 1a. Each word line group WL includes first and second word lines WL1, WL2. Each bit line group BL includes first and second bit lines BL1a, BL1b, BL2a, BL2b. Each memory cell MC1 is connected to one word line group WL and one bit line group BL.

A first row address decoder 21 decodes an externally applied first address signal A1 to select the first word line WL1 included in any one of the plurality of word line groups WL. A second row address decoder 22 decodes an externally applied second address signal A2 to select the second word line WL2 included in any one of the plurality of word line groups WL.

A word line driving circuit 3a drives the first word line WL1 selected by the first row address decoder 21 and the second word line WL2 selected by the second row address decoder 22 to "H" in response to first and second write enable signals (operation information signals) WE1, WE2.

The first row address decoder 21 for receiving the first address signal A1, the first word line WL1, and the first bit lines BL1a, BL1b correspond to a first port. The second row address decoder 22 for receiving the second address signal A2, the second word line WL2, and the second bit lines BL2a, BL2b correspond to a second port.

Figure 16:
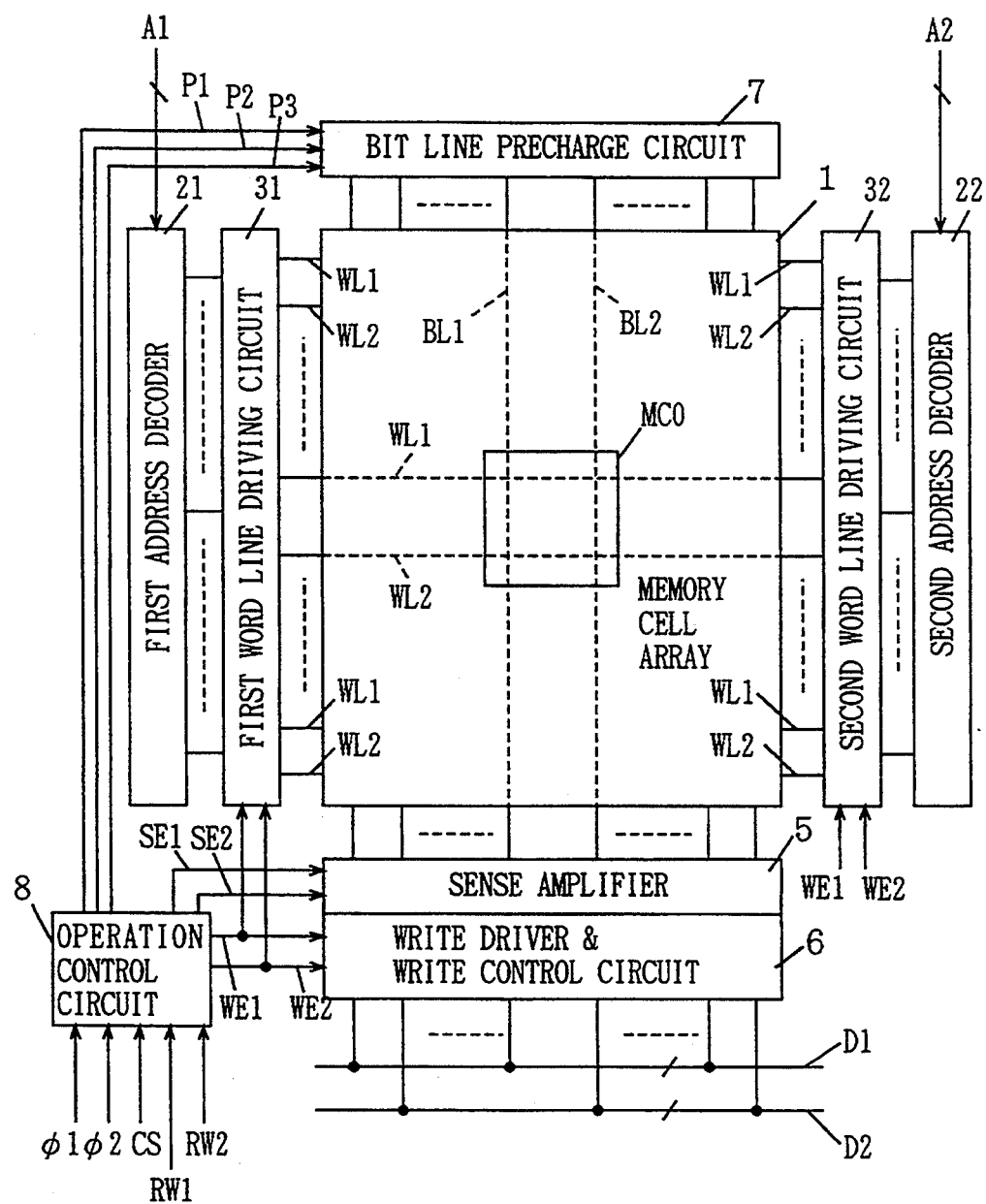
FIG. 16 is a block diagram showing a configuration of a conventional multiport memory.
Figure 17:
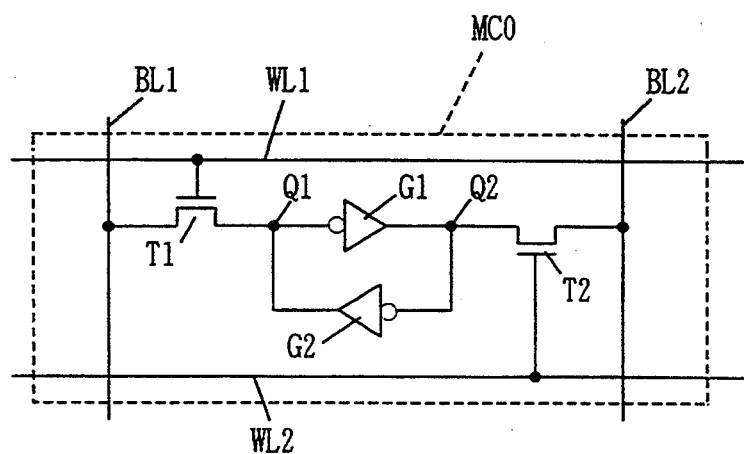
FIG. 17 is a schematic diagram of a circuit showing a configuration of a memory cell contained in the multiport memory of FIG. 16.
Figure 18:
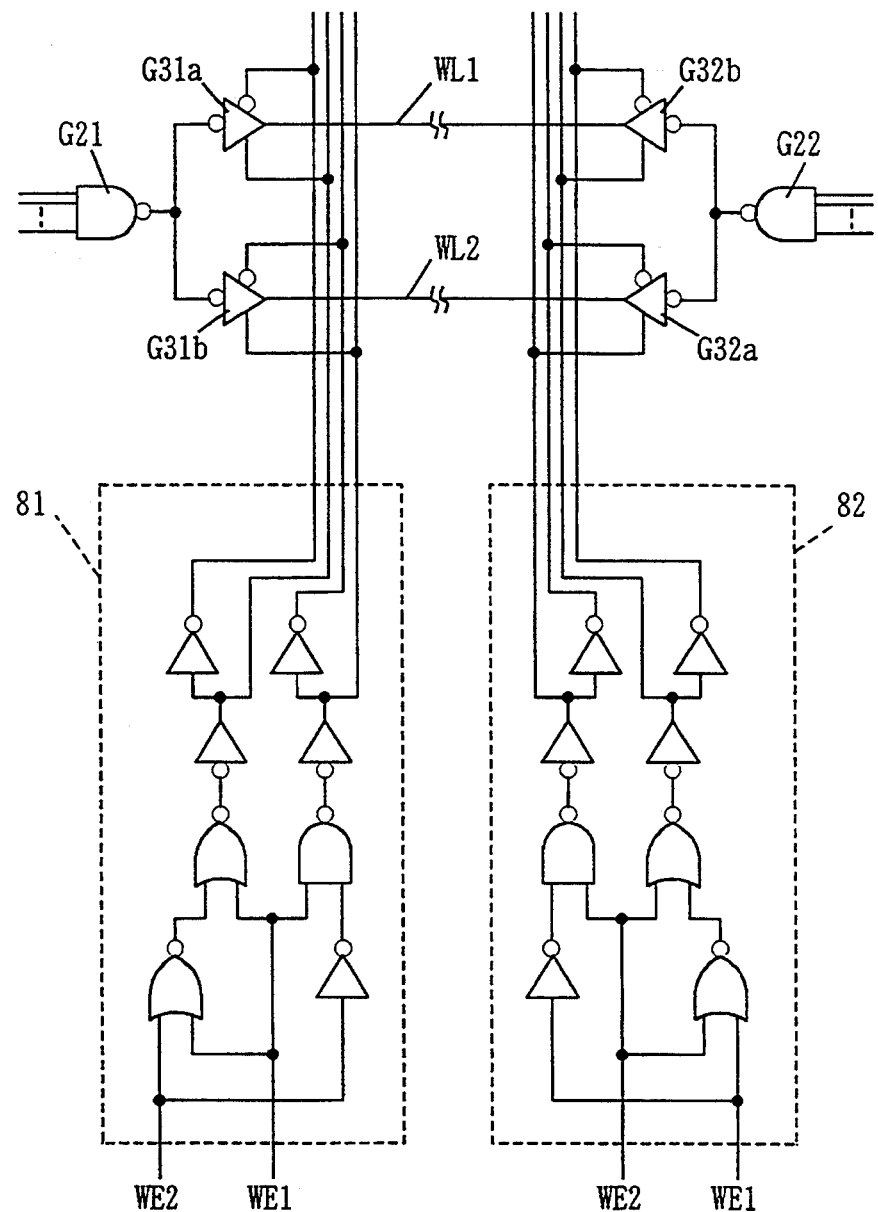
FIG. 18 is a schematic diagram of a circuit showing a partial configuration of first and second address decoders and first and second word line driving circuits contained in the multiport memory of FIG. 16.
Figure 19:
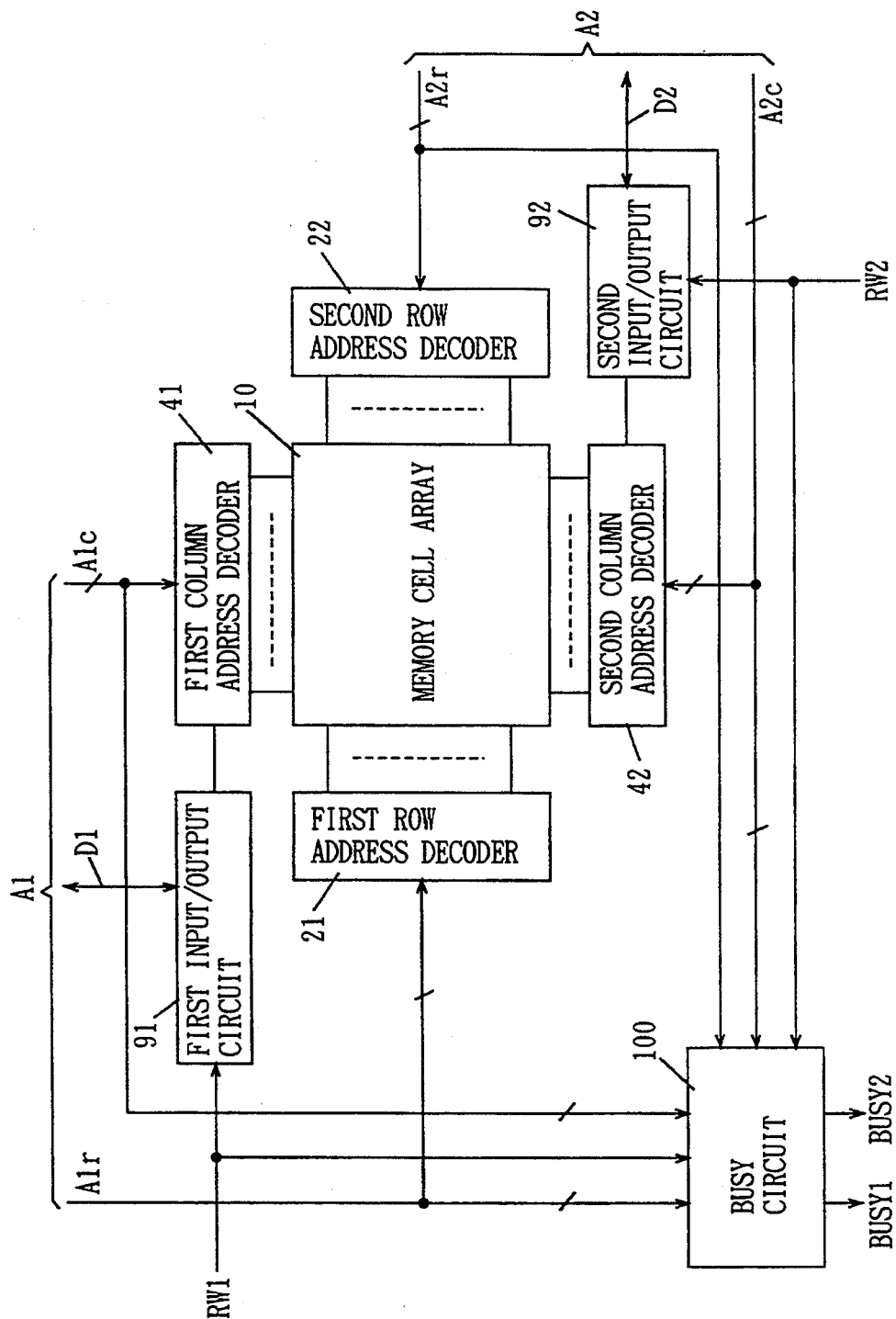
FIG. 19 is a block diagram showing a configuration of another conventional multiport memory.

Operations of a sense amplifier 5, a write driver & write control circuit 6 and a bit line precharge circuit 7 are similar to those of the sense amplifier 5, the write driver & write control circuit 6 and the bit line precharge circuit 7 shown in FIG. 16.

In the read operation, data read to a plurality of first bit lines BL1a, BL1b is amplified by sense amplifier 5 to be provided to a third data bus D3, or data read to a plurality of second bit lines BL2a, BL2b is amplified by the sense amplifier 5 to be provided to a fourth data bus D4.

In the write operation, data on a first data bus D1 is transferred to first bit lines BL1a, BL1b through the write driver & write control circuit 6, or data on a second data bus D2 is transferred to second bit lines BL2a, BL2b through the write driver & write control circuit 6. Operations of an operation control circuit 8a are similar to those of the operation control circuit 8 shown in FIG. 16.

Figure 2:
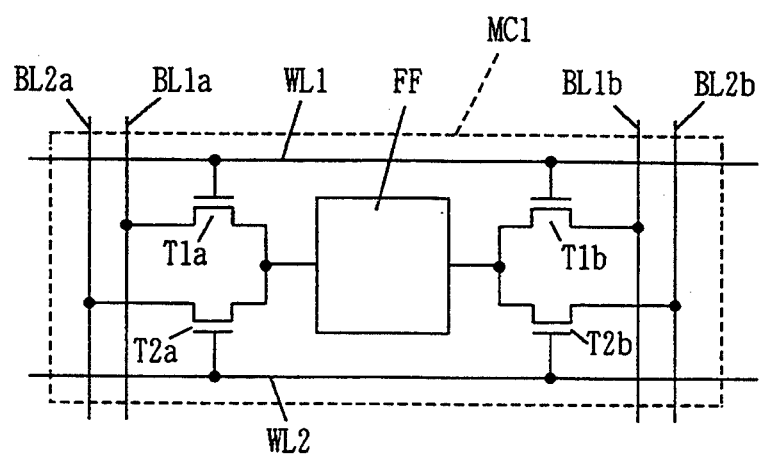
FIG. 2 is a diagram showing a configuration of a memory cell contained in the multiport memory of FIG. 1.
Figure 20:
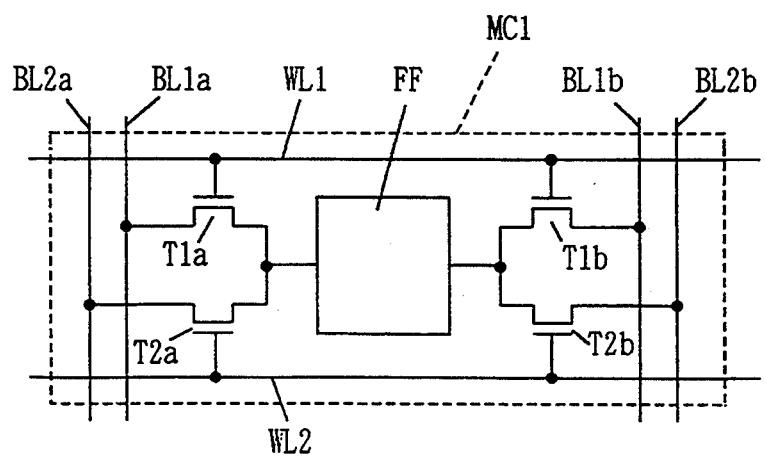
FIG. 20 is a diagram showing a configuration of a memory cell contained in the multiport memory of FIG. 19.
Figure 21:
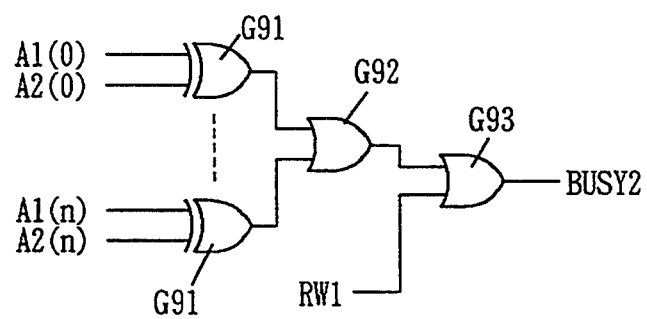
FIG. 21 is a schematic diagram of a circuit showing a configuration of a BUSY circuit.

FIG. 2 is a diagram showing a configuration of a 2-port memory cell MC1. The configuration of the memory cell MC1 shown in FIG. 2 is similar to that of the memory cell MC1 shown in FIG. 20. The memory cell MC1 includes a flip-flop circuit FF, first access gates T1a, T1b corresponding to the first port, and second access gates T2a, T2b corresponding to the second port.

Figure 3:
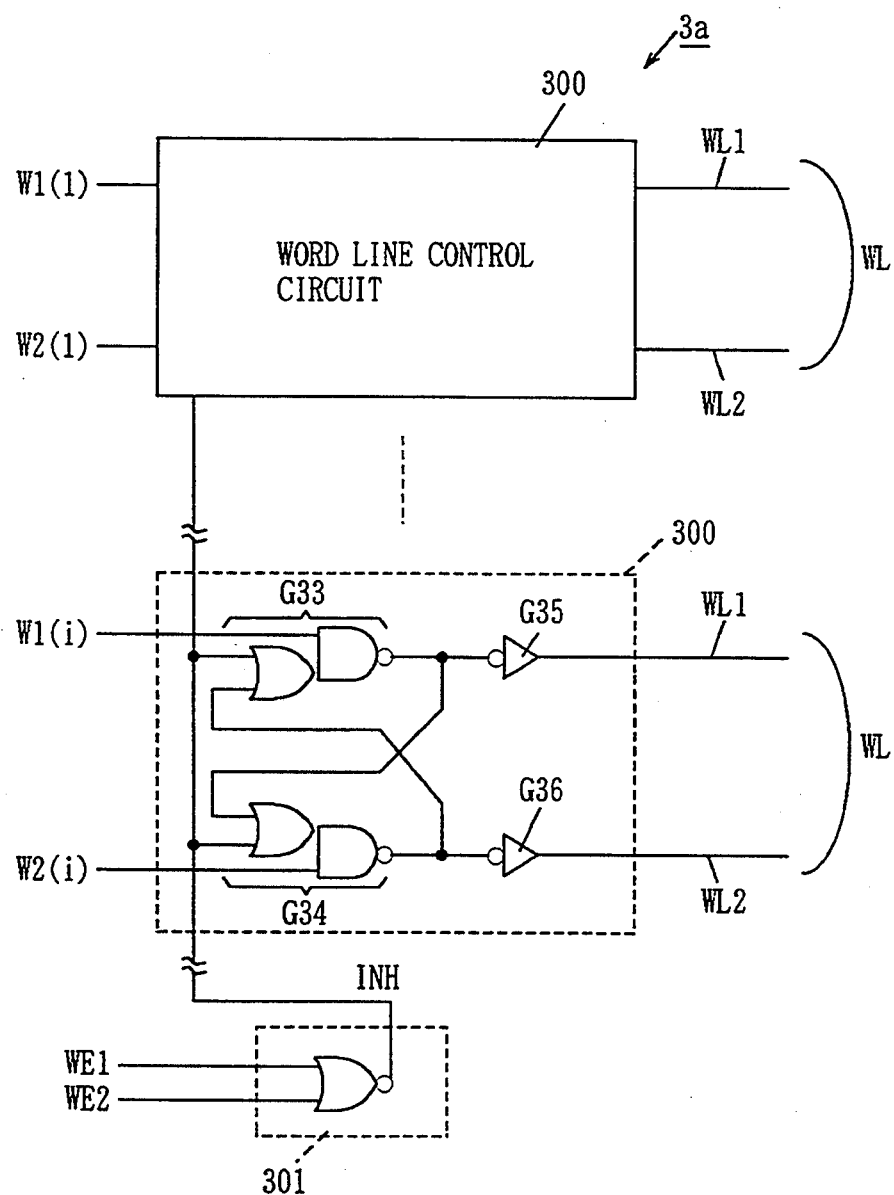
FIG. 3 is a diagram showing a configuration of a word line driving circuit contained in the multiport memory of FIG. 1.

FIG. 3 is a diagram showing a configuration of a word line driving circuit 3a. The word line driving circuit 3a includes a plurality of word line control circuits 300 corresponding to the plurality of word line groups WL, and a signal generating circuit 301 configured of an NOR circuit.

The signal generating circuit 301 generates an inhibit state setting signal INH in response to first and second write enable signals WE1, WE2. Each word line control circuit 300 includes composite gates G33, G34 and inverters G35, G36.

Each word line control circuit 300 receives an output signal W1 (i) to which the first row address decoder 21 corresponds, and an output signal W2 (i) to which the second row address decoder 22 corresponds, to drive the first and second word lines WL1, WL2 of a corresponding word line group WL, where i is a positive integer.

When both first and second write enable signals WE1, WE2 are at "L" (both first and second ports are at the read state), the composite gates G33, G34 phase-invert output signals W1 (i), W2 (i) at the same timing as an input timing to provide them to the inverters G35, G36, respectively. Inverter G35, G36 phase-invert outputs of the composite gates G33, G34 at the same timing as an input timing to provide them to the first and second word lines WL1, WL2, respectively.

When at least one of the first and second write enable signals WE1, WE2 is at "H" (at least one of the first and second ports is at the write state), the inhibit state setting signal INH attains "L". As a result, the composite gates G33, G34 operate as flip-flop. If the output signal W1 (i) attains "H" prior to the output signal W2 (i), the output signal W1 (i) is transmitted to the first word line WL1. If the output signal W2 (i) attains "H" prior to the output signal W1 (i), the output signal W2 (i) is transmitted to the second word line WL2.

Figure 4:
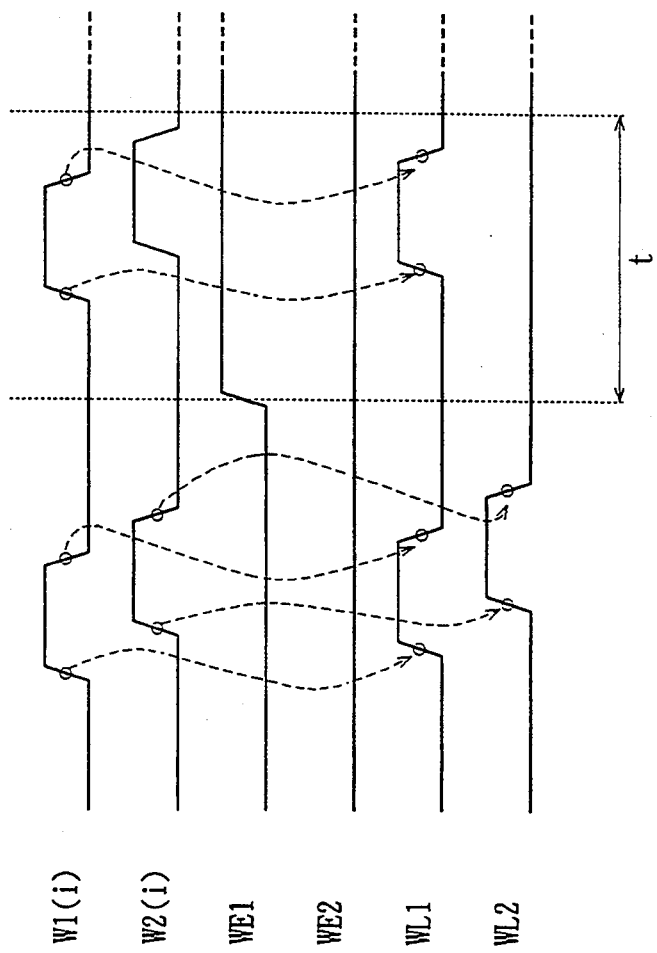
FIG. 4 is a waveform diagram showing operations of the word line driving circuit of FIG. 3.

As shown in an operation waveform diagram of FIG. 4, when both first and second write enable signals WE1, WE2 are at "L" (both first and second ports are at the read states), the first word line WL1 is driven to "H" in response to rise of the output signal W1 (i), and the second word line WL2 is driven to "H" in response to rise of the output signal W2 (i).

When the first write enable signal WE1 and the second write enable signal WE2 are at "H" (the first port is at the write state) and "L" (the second port is at the read state), respectively, the first word line WL1 is driven to "H" in response to the output signal W1 (i) which rose to "H" earlier. At that time, the second word line WL2 is retained "L". In FIG. 4, the period t is a period when the inhibit state is generated.

Operations are summarized in FIG. 5 when accesses to the same memory cell are carried out in the first and the second ports.

If both the first and the second ports are at the read state, accesses in the first and the second ports are both permitted (case 1). If at least one of the first and the second ports is at the write state, access in one port is permitted, while access in the other port is inhibited (cases 2, 3 and 4). In these cases, access to the port which initiated a selecting operation earlier is permitted.

Figure 6:
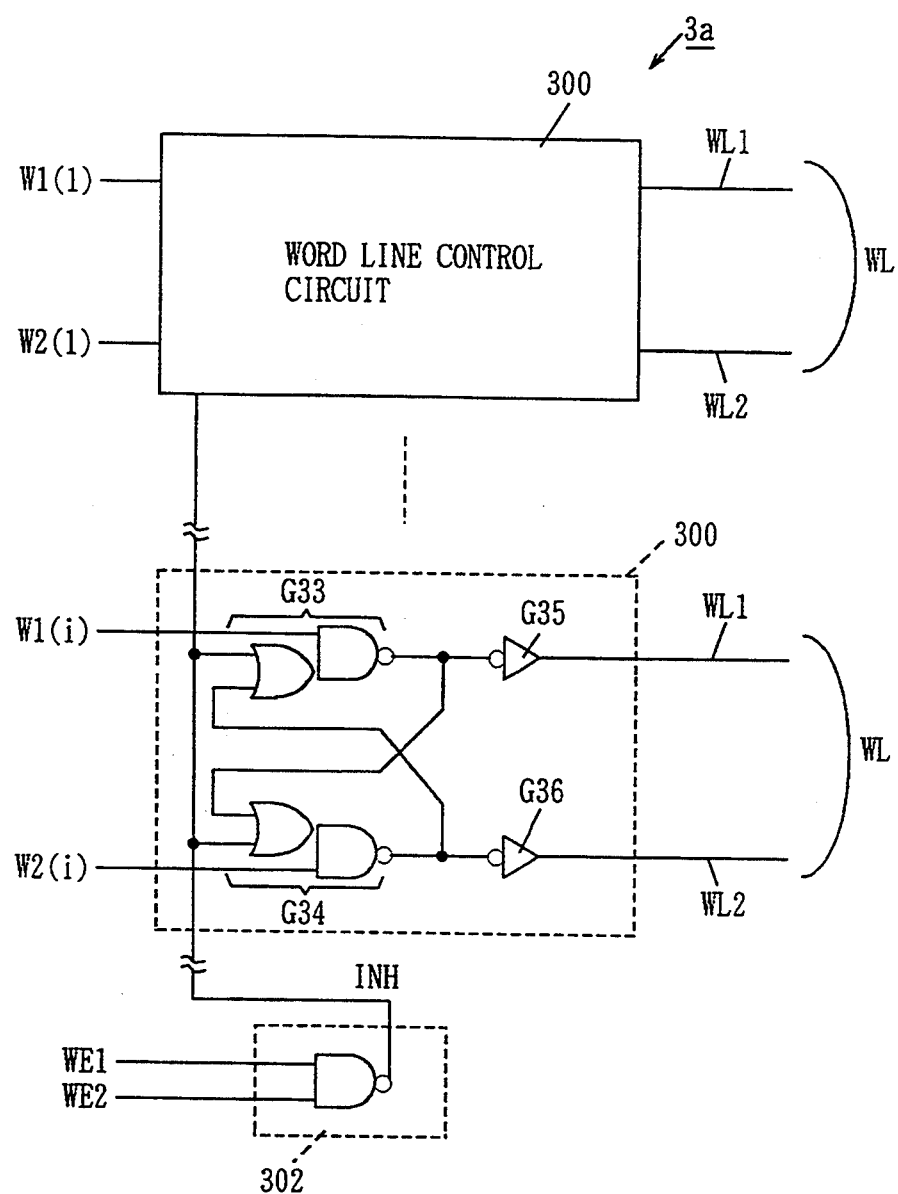
FIG. 6 is a diagram showing another example of the word line driving circuit contained in the multiport memory of FIG. 1.

FIG. 6 is a diagram showing another example of a configuration of the word line driving circuit 3a. The word line driving circuit 3a includes a plurality of word line control circuits 300 corresponding to a plurality of word line groups WL, and a signal generating circuit 302 configured of an NAND circuit. The configuration of each of the word line control circuits 300 is similar to that of the word line control circuit 300 shown in FIG. 3.

The signal generating circuit 302 generates the inhibit state setting signal INH in response to the first and second write enable signals WE1, WE2. When both first and second write enable signals WE1, WE2 are at "H" (both first and second ports are at the write states), the inhibit state setting signal INH attains "L". In this case, if the output signal W1 (i) rises to "H" prior to the output signal W2 (i), the output signal W1 (i) is transmitted to the first word line WL1. If the output signal W2

(i) rises to "H" prior to the output signal W1 (i), the output signal W2 (i) is transmitted to the second word line WL2.

When at least one of the first and second write enable signals WE1, WE2 is at "L" (at least one of the first and second ports is at the read state), the inhibit state setting signal INH attains "H". As a result, the output signal W1 (i) and the output signal W2 (i) are transmitted to the first word line WL1 and the second word line WL2, respectively.

Figure 7:
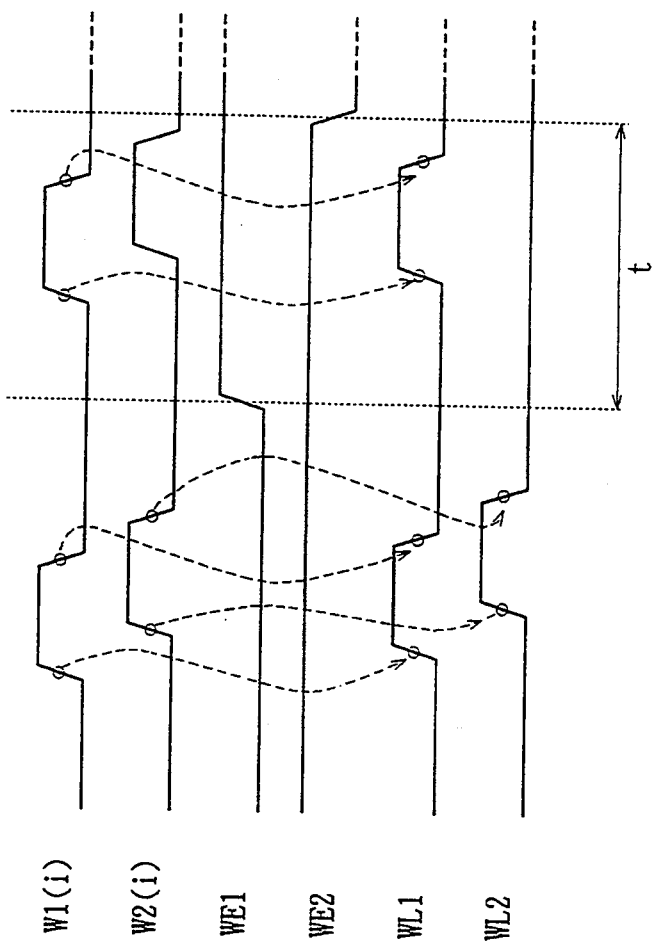
FIG. 7 is a waveform diagram showing operation of the word line driving circuit of FIG. 6.

As shown in FIG. 7, when the first write enable signal WE1 is at "L" (the first port is at the read state), and the second write enable signal WE2 is at "H" (the second port is at the write state), the first word line WL1 and the second word line WL2 are driven to "H" in response to rises of the output signal W1 (i) and the output signal W2 (i), respectively.

When both first and second write enable signals WE1, WE2 are at "H" (both first and second ports are at the write states), the first word line WL1 is driven to "H" in response to the output signal W1 (i) which rose to "H" earlier. At that time, the second word line WL2 is retained "L". In FIG. 7, the period t is a period when the inhibit state is generated.

Operations are summarized in FIG. 8 when accesses to the same memory cell are carried out in the first and the second ports.

If at least one of the first and the second ports is at the read state, accesses in the first and the second ports are both permitted (cases 1, 2 and 3). If both first and second ports are at the write states, access in one port is permitted, while access in the other port is inhibited (case 4). In this case, access is permitted to the port which initiated the selecting operation earlier.

As described above, when the word line driving circuit 3a shown in FIG. 3 is used, access in one port is permitted while access in the other port is inhibited, when at least one of the first and the second ports is set to the write state. When the word line driving circuit 3a shown in FIG. 6 is used, access in one port is permitted while access in the other port is inhibited, when both first and second ports are set to the write states.

(A Second Embodiment)

Figure 9:
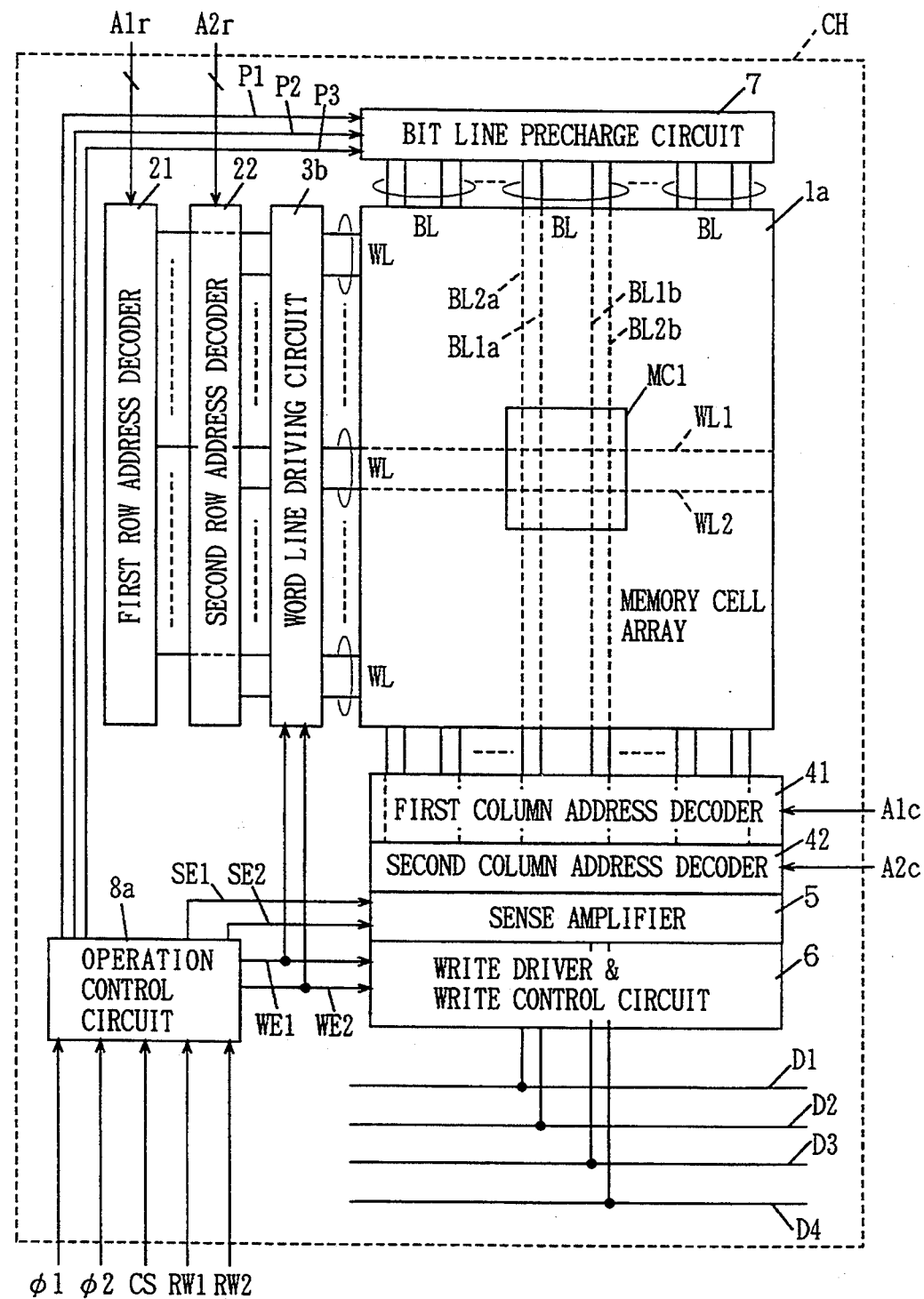
FIG. 9 is a block diagram showing a configuration of a multiport memory according to a second embodiment of the present invention.

FIG. 9 is a block diagram showing a configuration of a multiport memory according to a second embodiment of the present invention.

The multiport memory of FIG. 9 is different from that of FIG. 1 in that first and second column address decoders 41, 42 are provided in addition to the first and the second row address decoders 21, 22, and that the configuration of a word line driving circuit 3b is different from that of the word line driving circuit 3a.

The first row address decoder 21 decodes a first row address signal A1r to select the first word line WL1 included in any one of the plurality of word line groups WL. The second row address decoder 22 decodes a second row address signal A2r to select the second word line WL included in any one of the plurality of word line groups WL.

The first column address decoder 41 decodes a first column address signal A1c to select a set of first bit lines BL1a, BL1b included in any one of the plurality of bit line groups BL. The second column address decoder 42 decodes a second column address signal A2c to select a set of second bit lines BL2a, BL2b included in any one of the plurality of bit line groups BL.

In the read operation, data on the first bit lines BL1a, BL1b selected by the first column address decoder 41 is provided to the third data bus D3 through the sense amplifier 5, or data on the second bit lines BL2a, BL2b selected by the second column address decoder 42 is provided to the fourth data bus D4 through the sense amplifier 5.

In the write operation, write data on the first data bus D1 is provided to the first bit lines BL1a, BL1b selected by the first column address decoder 41 through the write driver & write control circuit 6, or write data on the second data bus D2 is provided to the second bit lines BL2a, BL2b selected by the second column address decoder 42 through the write driver & write control circuit 6.

Figure 10:
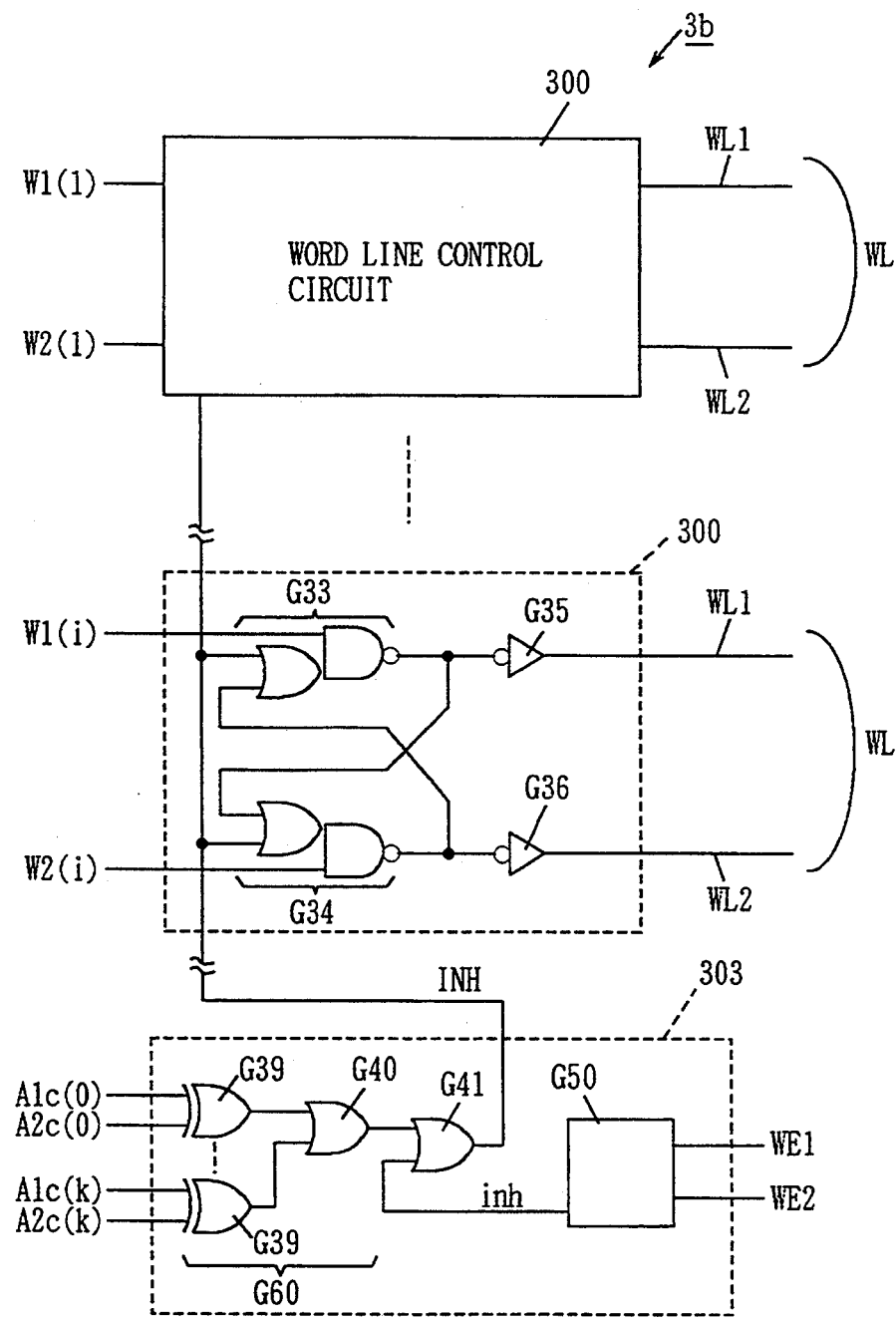
FIG. 10 is a diagram showing a configuration of a word line driving circuit contained in the multiport memory of FIG. 9.

FIG. 10 is a diagram showing a configuration of the word line driving circuit 3b. The word line driving circuit 3b includes a plurality of word line control circuits 300 corresponding to the plurality of word line groups WL, and a signal generating circuit 303. The configuration of the word line control circuit 300 is similar to that of the word line control circuit 300 shown in FIG. 3.

The signal generating circuit 303 includes a plurality of exclusive OR circuits G39, OR circuits G40, G41 and a logic gate circuit G50. 1-bit A1c (j) of the first column address signal A1c and 1-bit A2c (j) of the second column address signal A2c are provided to one input terminal and the other input terminal of the exclusive OR circuit G39, respectively, where j is any positive integer of 0 to k. The outputs of the plurality of exclusive OR circuits G39 are provided to the OR circuit G40. The plurality of exclusive OR circuits G39 and the OR circuit G40 configure a match/mismatch detecting circuit G60 for detecting match/mismatch of the first and the second column address signals A1c, A2c.

The logic gate circuit G50 carries out a predetermined logic operation with regard to the first and the second write enable signals WE1, WE2 to generate an output signal inh. The logic gate circuit G50 is configured of an NOR circuit as in the case of the signal generating circuit 301 shown in FIG. 3, or of an NAND circuit as in the case of the signal generating circuit 302 of FIG. 6.

An output signal of the OR circuit G40 and the output signal inh of the logic gate circuit G50 are applied to the OR circuit G41. The inhibit state setting signal INH is provided from the OR circuit G41.

When the logic gate circuit G50 is configured of an NOR circuit, the first and the second column address signals A1c, A2c match, and the inhibit state setting signal INH attains "L" when at least one of the first and the second write enable signals WE1, WE2 is at "H" (at least one of the first and the second port is at the write state). As a result, simultaneous accesses to the same memory cell by the first and the second ports are inhibited.

When the logic gate circuit G50 is configured of an NAND circuit, the first and the second column address signals A1c, A2c match, and the inhibit state setting signal INH attains "L" when both first and second write enable signals WE1, WE2 are at "H" (both first and second ports is at the write states). As a result, simultaneous accesses to the same memory cell by the first and the second ports are inhibited.

(A Third Embodiment)

Figure 11:
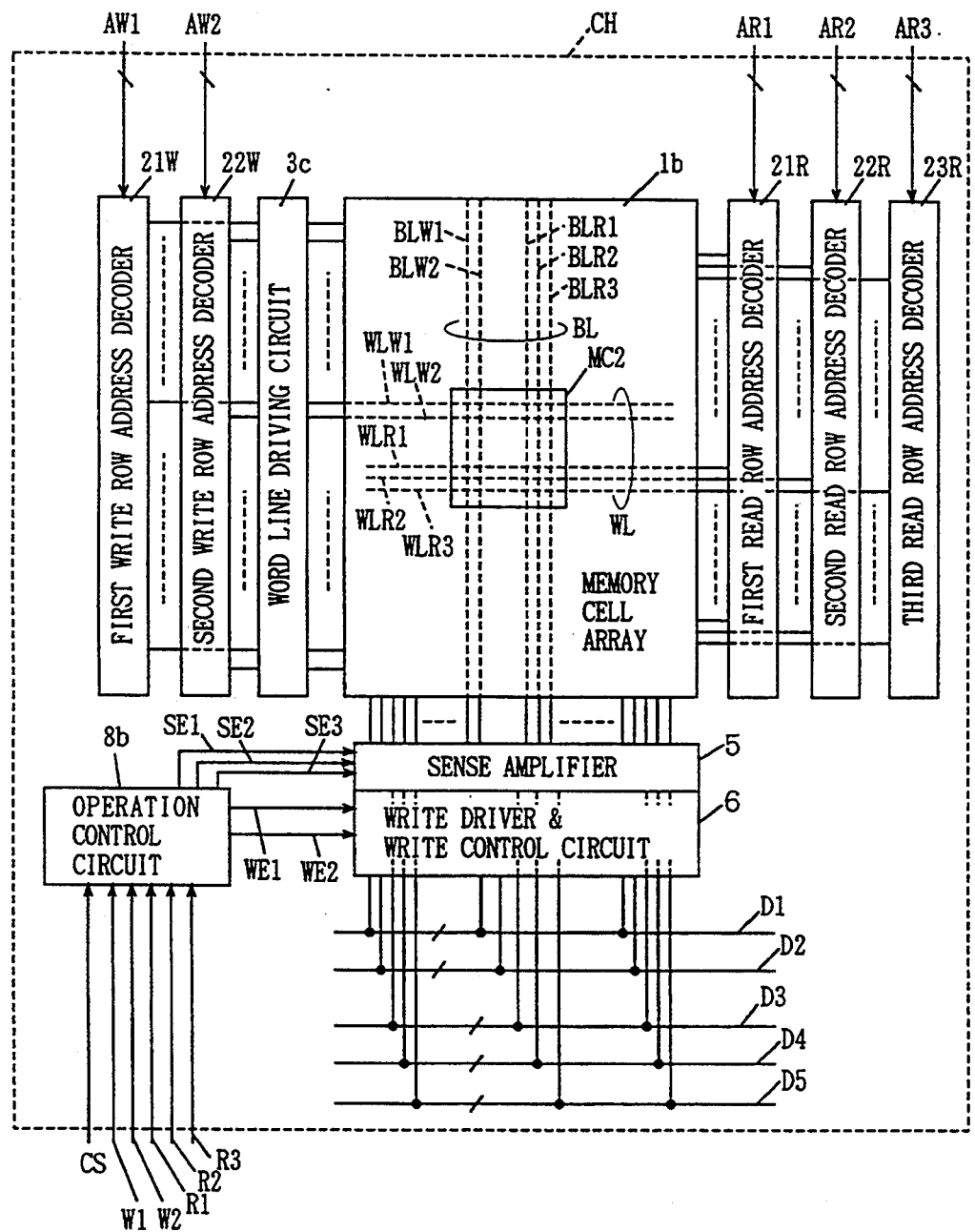
FIG. 11 is a block diagram showing a configuration of a multiport memory according to a third embodiment of the present invention.

FIG. 11 is a block diagram showing a configuration of a multiport memory according to a third embodiment of the present invention.

A memory cell array 1b includes a plurality of memory cells disposed in an array of a plurality of rows and a plurality of columns. In FIG. 11, one memory cell MC2 is shown. A plurality of word line groups WL are arranged corresponding to the plurality of rows in the memory cell array 1b, and a plurality of bit line sets BL are arranged corresponding to the plurality of columns in the memory cell array 1b. Each memory cell MC2 is connected to a corresponding word line group W1 and a corresponding bit line group BL.

Each word line group WL includes first and second word lines for write WLW1, WLW2, and first, second and third word lines for read WLR1, WLR2, WLR3. Each bit line group BL includes first and second bit lines for write BLW1, BLW2, and first, second and third bit lines for read BLR1, BLR2, BLR3.

A first write row address decoder 21W decodes a first write row address signal AW1 to select the first word line for write WLW1 included in any one of the plurality of word line groups WL. A second write row address decoder 22W decodes a second write row address signal AW2 to select the second word line for write WLW2 included in any one of the plurality of word line groups WL.

A first read row address decoder 21R decodes a first read row address signal AR1 to select the first word line for read WLR1 included in any one of the plurality of word line groups WL. A second read row address decoder 22R decodes a second read row address signal AR2 to select the second word line for read WLR2 included in any one of the plurality of word line groups WL. A third read row address decoder 23R decodes a third read row address signal AR3 to select the third word line for read WLR3 included in any one of the plurality of word line groups WL.

While the first write row address signal AW1 corresponds to the first port for write, the second write row address signal AW2 corresponds to the second port for write. The first read row address signal AR1, the second read row address signal AR2, and the third read row address signal AR3 correspond to the first port for read, the second port for read, and the third port for read, respectively.

In the write operation of the first port for write, write data on the first data bus D1 is provided to a plurality of first bit lines for write BLW1 through the write driver & write control circuit 6. In the write operation of the second port for write, write data on the second data bus D2 is provided to a plurality of second bit lines for write BLW2 through the write driver & write control circuit 6.

In the read operation of the first port for read, data on a plurality of second bit lines for read BLR1 is provided to the third data bus D3 through the sense amplifier 5. In the read operation of the second port for read, data on a plurality of second bit lines for read BLR2 is provided to the fourth data bus D4 through the sense amplifier 5. In the read operation of the third port for read, data on a plurality of third bit lines for read BLR3 is provided to the fifth data bus D5 through the sense amplifier 5.

A word line driving circuit 3c is connected only to the first and the second word lines for write WLW1, WLW2, and a normal driving circuit is connected to the first, the second and the third word lines for read WLR1, WLR2, WLR3.

An operation control circuit 8b is provided with first and second write signals W1, W2 for controlling operations of the first and the second ports for write, and first, second and third read signals R1, R2, R3 for controlling operations of the first, the second and the third ports for read.

Figure 12:
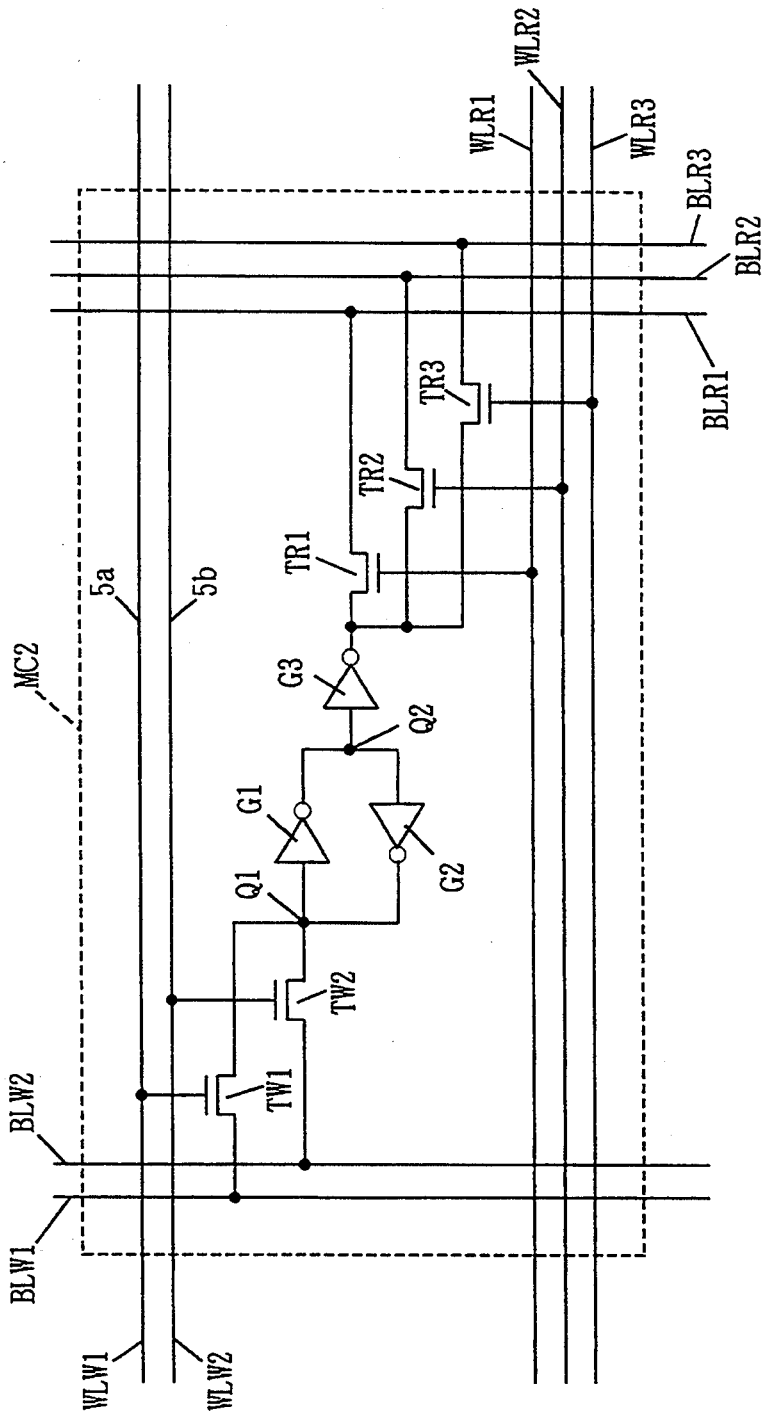
FIG. 12 is a schematic diagram of a circuit showing a configuration of a memory cell contained in the multiport memory of FIG. 11.

FIG. 12 is a schematic diagram of a circuit showing a configuration of the memory cell MC2. The memory cell MC2 has the first and the second ports for write, and the first, the second and the third ports for read.

The memory cell MC2 includes inverters G1, G2, G3, first and second access gates for write TW1, TW2 configured of an N channel MOS transistor, and first, second and third access gates for read TR1, TR2, TR3 configured of an N channel MOS transistor. Inverters G1, G2 are connected between storage nodes Q1 and Q2 to configure a latch circuit.

The first access gate for write TW1 is connected between the storage node Q1 and the first bit line for write BLW1 to be rendered conductive or non-conductive in response to the potential of the first word line for write WLW1. The second access gate for write TW2 is connected between the storage node Q1 and the second bit line for write BLW2 to be rendered conductive or non-conductive in response to a potential of the second word line for write WLW2. The inverter G3 is connected to the storage node Q2.

The first access gate for read TR1 is connected between an output terminal of the inverter G3 and the first bit line for read BLR1 to be rendered conductive or non-conductive in response to a potential of the first word line for read WLR1. The second access gate for read TR2 is connected between an output terminal of the inverter G3 and the second bit line for read BLR2 to be rendered conductive or non-conductive in response to a potential of the second word line for read WLR2. The third access gate for read TR3 is connected between an output terminal of the inverter G3 and the third bit line for read BLR3 to be rendered conductive or non-conductive in response to a potential of the third word line for read WLR3.

Figure 13:
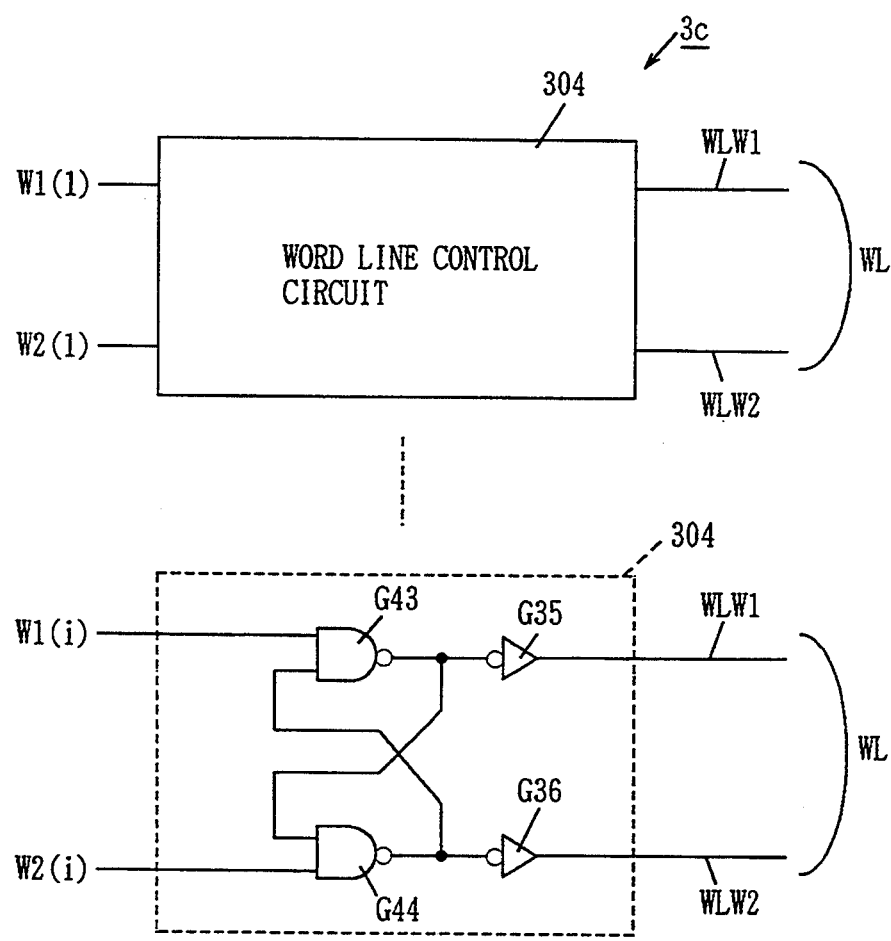
FIG. 13 is a diagram showing a configuration of a word line driving circuit contained in the multiport memory of FIG. 11.

FIG. 13 is a diagram showing a configuration of the word line driving circuit 3c. The word line driving circuit 3c includes a plurality of word line control circuits 304 corresponding to the plurality of word line groups WL.

Each word line control circuit 304 receives the output signal W1 (i) to which the first write row address decoder 21W corresponds and the output signal W2 (i) to which the second write row address decoder 22W corresponds to drive the corresponding first word line for write WLW1 and the corresponding second word line for write WLW2. Each word line control circuit 304 includes NAND circuits G43, G44 in place of the composite gates G33, G34 in the word line control circuit 300 shown in FIG. 3.

When the output signal W1 (i) rises to "H" earlier than the output signal W2 (i), the first word line for write WLW1 is driven to "H". When the output signal W2 "i" rises to "H" earlier than the output signal W1 (i), the second word line for write WLW2 is driven to "H".

In this embodiment, since a word line for write and a word line for read are provided separately, it is not necessary to provide a signal generating circuit for generating the inhibit state setting signal INH in response to the first and the second write enable signals WE1, WE2 as shown in FIGS. 3 and 6.

(A Fourth Embodiment)

Figure 14:
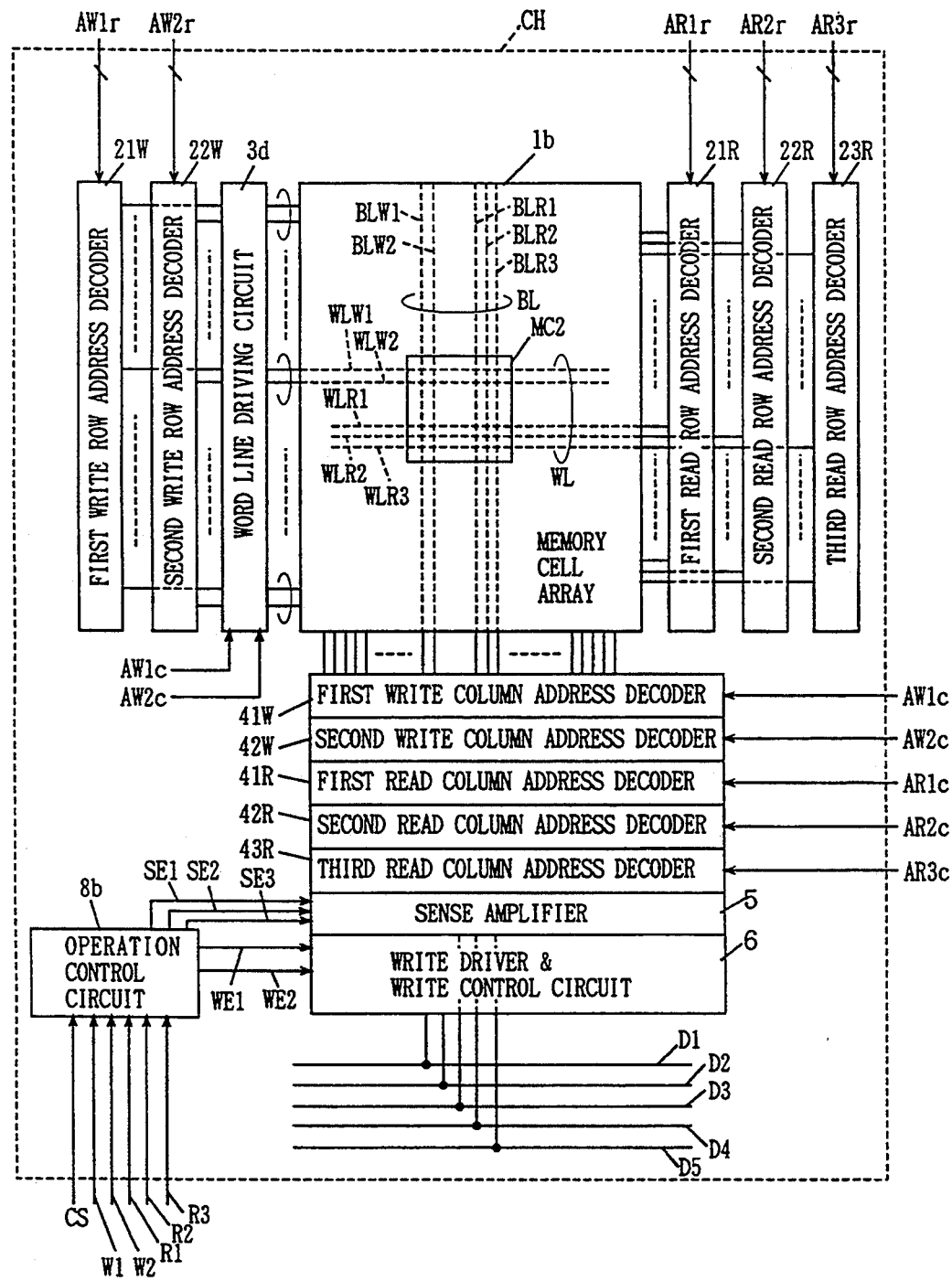
FIG. 14 is a block diagram showing a configuration of a multiport memory according to a fourth embodiment of the present invention.

FIG. 14 is a block diagram showing a configuration of a multiport memory according to a fourth embodiment of the present invention.

The multiport memory of FIG. 14 is different from that of FIG. 11 in that first and second write column address decoders 41W, 42W, and first, second and third read column address decoders 41R, 42R, 43R are further provided.

The first and the second write row address decoders 21W, 22W receive first and second write row address signals AW1r, AW2r corresponding to the first and the second ports for write, respectively. The first, the second and the third read row address decoders 21R, 22R, 23R receive first, second and third read row address signals AR1r, AR2r, AR3r corresponding to the first, the second and the third ports for read, respectively.

The first and second write column address decoders 41W, 42W receive first and second write column address signals AW1c, AW2c corresponding to the first and the second ports for write, respectively. The first, the second and the third read column address decoders 41R, 42R, 43R receive first, second and third read column address signals AR1c, AR2c, AR3c corresponding to the first, the second and the third ports for read, respectively.

Figure 15:
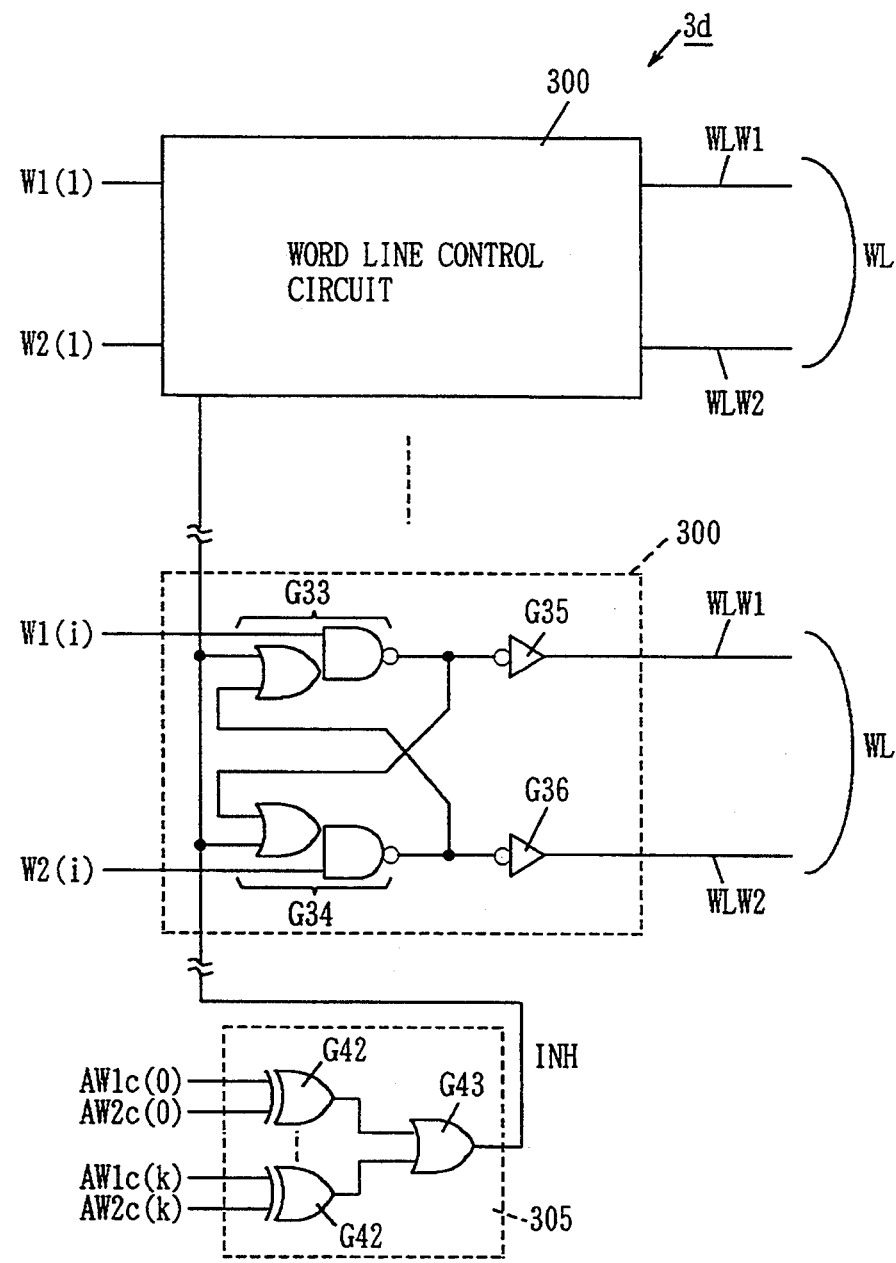
FIG. 15 is a diagram showing a configuration of a word line driving circuit contained in the multiport memory of FIG. 14.

FIG. 15 is a diagram showing a configuration of a word line driving circuit 3d. The word line driving circuit 3d includes a plurality of word line control circuits 300 corresponding to the plurality of word line groups WL and a signal generating circuit 305.

Each word line control circuit 300 receives the output signal W1 (i) to which the first write row address decoder 21W corresponds and the output signal W2 (i) to which the second write row address decoder 22W corresponds to drive the corresponding first word line for write WLW1 and the corresponding second word line for write WLW2. The configuration of each word line control circuit 300 is similar to that of the word line control circuit 300 shown in FIG. 3.

The signal generating circuit 305 includes a plurality of exclusive OR circuits G42 and an OR circuit G43. 1-bit AW1c (j) of first write column address signal AW1c and 1-bit AW2c (j) of second write column address signal AW2c are applied to one input terminal and the other input terminal of each exclusive OR circuit G42, respectively, where j is an integer of 0 to k. The output of the plurality of exclusive OR circuits G42 is provided to the OR circuit G43. The inhibit state setting signal INH is provided from the OR circuit G43.

When the first and the second write column address signals AW1c, AW2c match, the inhibit state setting signal INH attains "L". As a result, simultaneous accesses to the same memory cell by the first and the second ports for write are inhibited.

Also in this embodiment, since a word line for write and a word line for read are provided separately, the signal generating circuit 305 need not respond to the first and the second write enable signals WE1, WE2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiport memory device, comprising:
at least a first port and a second port;
a plurality of memory cells for storing data;
a plurality of access means for accessing any of said plurality of memory cells independently, said plurality of access means enabling simultaneous access for writing and reading data to and from any of said plurality of memory cells via said first and second ports;
inhibit means providing a signal to said plurality of the access means for inhibiting simultaneous access to the same memory cell by at least two access means in accordance with a predetermined inhibit condition; and
a plurality of word line groups connected to said plurality of memory cells and at least one bit line group connected to said plurality of memory cells, wherein
said inhibit means comprises
signal generating means for generating an inhibit state setting signal in accordance with said predetermined inhibit conditions, and
control means responsive to said inhibit state setting means for inhibiting, when accesses to the same memory cell by at least two access means are in contention, simultaneous accesses to the same memory cell;
said plurality of access means include a plurality of word line selecting means;
each of said plurality of word line groups includes a plurality of word lines corresponding to said plurality of word line selecting means;
each of said at least one bit line group includes a plurality of bit lines corresponding to said plurality of word lines;
each of said plurality of word line selecting means selects one of corresponding word lines within said plurality of word line groups in response to an address signal;
said signal generating means generates said inhibit state setting signal in response to a plurality of read/write control signals provided corresponding to said plurality of access means;
said control means includes driving means responsive to said inhibit state setting signal for driving, when at least two word line selecting means select word lines in the same word line group, a word line selected by one of said at least two word line selecting means;
each of said plurality of memory cells comprises holding means for hold data, and
a plurality of transfer gate means respectively connected between said holding means and a plurality of bit lines in a corresponding bit line group, and respectively controlled by potentials of a plurality of word lines in a corresponding word line group; and
said driving means drives a word line selected by word line selecting means which initiated a selecting operation the earliest in response to said inhibit state setting signal, when at least two word line selecting means select word lines in the same word line group.

2. A multiport memory device, comprising:
at least a first port and a second port;
a plurality of memory cells for storing data;
a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups connected to said plurality of memory cells and at least one bit line group connected to said plurality of memory cells, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell;

said plurality of access means includes a plurality of word line selecting means;

each of said plurality of word line groups includes a plurality of word lines corresponding to said plurality of word line selecting means;

each of said at least one bit line group includes a plurality of bit lines corresponding to said plurality of word lines;

each of said plurality of word line selecting means selects one of corresponding word lines within said plurality of word line groups in response to an address signal;

said signal generating means generates said inhibit state setting signal in response to a plurality of read/write control signals provided corresponding to said plurality of access means;

said control means includes driving means responsive to said inhibit state setting signal for driving, when at least two word line selecting means select word lines in the same word line group, a word line selected by one of said at least two word line selecting means;

each of said plurality of word line selecting means generates output signals for selecting corresponding word lines in said plurality of word line groups;

said driving means includes a plurality of holding circuits provided corresponding to said plurality of word line groups; and each of said plurality of holding circuits receives corresponding output signals from said plurality of word line selecting means to hold the earliest activated output signal of said corresponding output signals and provide the same to a corresponding word line in response to the activated state of said inhibit state setting signal, and to provide said corresponding output signals to respective corresponding word lines in response to the non-activated state of said inhibit state setting signal.

3. A multiport memory device, comprising:

at least a first port and a second port;

a plurality of memory cells for storing data;

a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups and a plurality of bit line groups, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell;

said plurality of memory cells are arranged in a plurality of rows and a plurality of columns;

said plurality of word line groups are provided corresponding to said plurality of rows and each is connected to memory cell of a corresponding row;

said plurality of bit line groups are provided corresponding to said plurality of columns and each is connected to memory cell of a corresponding column;

said plurality of access means include a plurality of word line selecting means and plurality of bit lines selecting means corresponding to said plurality of word line selecting means;

each of said plurality of word line groups includes a plurality of word lines corresponding to said plurality of word line selecting means;

each of said plurality of bit line groups includes a plurality of bit lines corresponding to said plurality of word lines;

each of said plurality of word line selecting means selects one of corresponding word lines in said plurality of word line groups in response to a row address signal;

each of said plurality of bit line selecting means selects one of corresponding bit lines in said plurality of bit line groups in response to a column address signal;

said signal generating means generates said inhibit state setting signal in response to a plurality of write/read control signals provided corresponding to said plurality of access means, when at least two bit line selecting means select bit lines in the same bit line group;

said control means includes driving means responsive to said inhibit state setting signal for driving, when at least two word line selecting means select word lines in the same word line group, a word line selected by one of said at least two word line selecting means; and said driving means drives a word line selected by word line selecting means which initiated a selecting operation the earliest in response to said inhibit state setting signal, when at least two word line selecting means select word lines in the same word line group.

4. A multiport memory device, comprising:

at least a first port and a second port;

a plurality of memory cells for storing data;

a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups and a plurality of bit line groups, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell;

said plurality of memory cells are arranged in a plurality of rows and a plurality of columns;

said plurality of word line groups are provided corresponding to said plurality of rows and each is connected to memory cell of a corresponding row;

said plurality of bit line groups are provided corresponding to said plurality of columns and each is connected to memory cell of a corresponding column;

said plurality of access means include a .plurality of word line selecting means and a plurality of bit line selecting means corresponding to said plurality of word line selecting means;

each of said plurality of word line groups includes a plurality of word lines corresponding to said plurality of word line selecting means;

each of said plurality of bit line groups includes a plurality of bit lines corresponding to said plurality of word lines;

each of said plurality of word line selecting means selects one of corresponding word lines in said plurality of word line groups in response to a row address signal;

each of said plurality of bit line selecting means selects one of corresponding bit lines in said plurality of bit line groups in response to a column address signal;

said signal generating means generates said inhibit state setting signal in response to a plurality of write/read control signals provided corresponding to said plurality of access means, when at least two bit line selecting means select bit lines in the same bit line group;

said control means includes driving means responsive to said inhibit state setting signal for driving, when at least two word line selecting means select word lines in the same word line group, a word line selected by one of said at least two word line selecting means;

each of said plurality of word line selecting means generates a plurality of output signals for selecting corresponding word lines in said plurality of word line groups;

said driving means includes a plurality of holding circuits provided corresponding to said plurality of word line groups; and each of said plurality of holding circuits receives corresponding output signals from said plurality of word line selecting means to hold the earliest activated output signal of said corresponding output signals and provide the same to a corresponding word line in response to the activated state of said inhibit state setting signal, and to provide said corresponding output signals to respective corresponding word lines in response to the non-activated state of said inhibit state setting signal.

5. A multiport memory device, comprising:

at least a first port and a second port;

a plurality of memory cells for storing data;

a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups and a plurality of bit line groups, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell;

said plurality of memory cells are arranged in a plurality of rows and a plurality of columns;

said plurality of word line groups are provided corresponding to said plurality of rows and each is connected to memory cell of a corresponding row;

said plurality of bit line groups are provided corresponding to said plurality of columns and each is connected to memory cell of a corresponding column;

said plurality of access means include a plurality of word line selecting means and a plurality of bit line selecting means corresponding to said plurality of word line selecting means;

each of said plurality of word line groups includes a plurality of word lines corresponding to said plurality of word line selecting means;

each of said plurality of bit line groups includes a plurality of bit lines corresponding to said plurality of word lines;

each of said plurality of word line selecting means selects one of corresponding word lines in said plurality of word line groups in response to a row address signal;

each of said plurality of bit line selecting means selects one of corresponding bit lines in said plurality of bit line groups in response to a column address signal;

said signal generating means generates said inhibit state setting signal in response to a plurality of write/read control signals provided corresponding to said plurality of access means, when at least two bit line selecting means select bit lines in the same bit line group;

said control means includes driving means responsive to said inhibit state setting signal for driving, when at least two word line selecting means select word lines in the same word line group, a word line selected by one of said at least two word line selecting means; and said signal generating means comprises
a first logic gate for carrying out a predetermined logic operation on said plurality of read/write control signals,
match detecting means for detecting at least two matches of said plurality of column address signals, and
a second logic gate for carrying out a predetermined logic operation on an output of said first logic gate and an output of said match detecting means.

6. A multiport memory device comprising:
at least a first port and a second port;
a plurality of memory cells for storing data;
a plurality of access means for accessing any of said plurality of memory cells independently, said plurality of access means enabling simultaneous access for writing and reading data to and from any of said plurality of memory cells via said first and second ports;
inhibit means providing a signal to said plurality of the access means for inhibiting simultaneous access to the same memory cell by at least two access means in accordance with a predetermined inhibit condition; and
a plurality of word line groups connected to said plurality of memory cells and at least one bit line group connected to said plurality of memory cells, wherein
said inhibit means comprises
signal generating means for generating an inhibit state setting signal in accordance with said predetermined inhibit conditions, and
control means responsive to said inhibit state setting means for inhibiting, when accesses to the same memory cell by at least two access means are in contention, simultaneous accesses to the same memory cell;
said plurality of access means include a plurality of write word line selecting means and a plurality of read word line selecting means;
each of said plurality of word line groups includes a plurality of write word lines corresponding to said plurality of write word line selecting means and a plurality of read word lines corresponding to said plurality of read word line selecting means;
each of said at least one bit line group includes a plurality of write bit lines corresponding to said plurality of write word lines and a plurality of read bit lines corresponding to said plurality of read word lines;
each of said plurality of write word line selecting means selects one of corresponding write word lines in said plurality of word line groups in response to a write row address signal;
each of said plurality of read word line selecting means selects one of corresponding read word lines in said plurality of word line groups in response to a read row address signal;
said inhibit means includes a driving means for driving, when at least two write word line selecting means select word lines in the same write word line group, a word line selected by one of said at least two word line selecting means; and
said driving means drives a word line selected by word line selecting means which initiated selecting operation the earliest, when at least two word line selecting means select word lines in the same word line group.

7. A multiport memory device, comprising:
at least a first port and a second port;
a plurality of memory cells for storing data;
a plurality of access means for accessing any of said plurality of memory cells independently, said plurality of access means enabling simultaneous access for writing and reading data to and from any of said plurality of memory cells via said first and second ports;
inhibit means providing a signal to said plurality of the access means for inhibiting simultaneous access to the same memory cell by at least two access means in accordance with a predetermined inhibit condition; and
a plurality of word line groups connected to said plurality of memory cells and at least one bit line group connected to said plurality of memory cells, wherein
said inhibit means comprises
signal generating means for generating an inhibit state setting signal in accordance with said predetermined inhibit conditions, and
control means responsive to said inhibit state setting means for inhibiting, when accesses to the same memory cell by at least two access means are in contention, simultaneous accesses to the same memory cell;
said plurality of access means include a plurality of write word line selecting means and a plurality of read word line selecting means;
each of said plurality of word line groups includes a plurality of write word lines corresponding to said plurality of write word line selecting means and a plurality of read word lines corresponding to said plurality of read word line selecting means;
each of said at least one bit line group includes a plurality of write bit lines corresponding to said plurality of write word lines and a plurality of read bit lines corresponding to said plurality of read word lines;
each of said plurality of write word line selecting means selects one of corresponding write word lines in said plurality of word line groups in response to a write row address signal;
each of said plurality of read word line selecting means selects one of corresponding read word lines in said plurality of word line groups in response to a read row address signal,
said inhibit means includes a driving means for driving, when at least two write word line selecting means select word lines in the same write word line group, a word line selected by one of said at least two word line selecting means; and
each of said plurality of write word line selecting means generates a plurality of output signals for selecting corresponding write word lines in the same word line group.

8. A multiport memory device, comprising:
at least a first port and a second port;
a plurality of memory cells for storing data;
a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups connected to said plurality of memory cells and at least one bit line group connected to said plurality of memory cells, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell said plurality of memory cells are arranged in a plurality of rows and a plurality of columns;

said plurality of word line groups are provided corresponding to said plurality of rows and each is connected to a memory cell of a corresponding row;

said plurality of bit line groups are provided corresponding to said plurality of columns and each is connected to a memory cell of a corresponding column;

said plurality of access means includes a plurality of write word line selecting means, a plurality of read word line selecting means, a plurality of write bit line selecting means corresponding to said plurality of write word line selecting means, and a plurality of read bit line selecting means corresponding to said plurality of read word line selecting means;

each of said plurality of word line groups includes a plurality of write word lines corresponding to said plurality of write word line selecting means, and a plurality of read word lines selecting means, and a plurality of read word lines corresponding to said plurality of read word line selecting means;

each of said plurality of bit line groups includes a plurality of write bit lines corresponding to said plurality of write word lines, and a plurality of read bit lines corresponding to said plurality of read word line;

each of said plurality of write word line selecting means selects one of corresponding write word lines in said plurality of word line groups in response to a write row address signal;

each of said plurality of read word line selecting means selects one of corresponding read word lines in said plurality of word line groups in response to a read row address signal;

each of said plurality of write bit line selecting means selects one of corresponding write bit lines in said plurality of bit line groups in response to a write column address signal;

said signal generating means generates said inhibit state setting signal when at least two write bit line selecting means select write bit lines in the same bit line group;

said control means includes driving means for driving, when at least two write word line selecting means select write word lines in the same word line group, a word line selected by one of said at least two write word line selecting means in response to said inhibit state setting signal; and said driving means drives a write word line selected by a write word line selecting means which initiated selecting operation the earliest in response to said inhibit state setting signal, when at least two write word line selecting means selects write word lines within the same word line group.

9. A multiport memory device, comprising:

at least a first port and a second port;

a plurality of memory cells for storing data;

a plurality of access means for accessing any of said plurality of memory cells independently, said plurality of access means enabling simultaneous access for writing and reading data to and from any of said plurality of memory cells via said first and second ports;

inhibit means providing a signal to said plurality of the access means for inhibiting simultaneous access to the same memory cell by at least two access means in accordance with a predetermined inhibit condition; and a plurality of word line groups connected to said plurality of memory cells and at least one bit line group connected to said plurality of memory cells, wherein said inhibit means comprises signal generating means for generating an inhibit state setting signal in accordance with said predetermined inhibit conditions, and control means responsive to said inhibit state setting means for inhibiting, when accesses to the same memory cell by at least two access means are in contention, simultaneous accesses to the same memory cell;

said plurality of memory cells are arranged in a plurality of rows and a plurality of columns;

said plurality of word line groups are provided corresponding to said plurality of rows and each is connected to a memory cell of a corresponding row;

said plurality of bit line groups are provided corresponding to said plurality of columns and each is connected to a memory cell of a corresponding column;

said plurality of access means include a plurality of write word line selecting means, a plurality of read word line selecting means, a plurality of write bit line selecting means corresponding to said plurality of write word line selecting means, and a plurality of read bit line selecting means corresponding to said plurality of read word line selecting means;

each of said plurality of word line groups includes a plurality of write word lines corresponding to said plurality of write word line selecting means, and a plurality of read word lines selecting means, and a plurality of read word lines c to said p of read word line selecting means;

each of said plurality of write word line selecting means selects one of corresponding write word line in said plurality of word line groups in response to a write row address signal;

each of said plurality of read word line selecting means selects one of corresponding read word lines in said plurality of word line groups in response to a read row address signal;

each of said plurality of write bit line selecting means selects one of corresponding write bit lines in said plurality of bit line groups in response to a write column address signal;

each of said plurality of read bit line selecting means selects one of corresponding read bit lines in said plurality of bit line groups in response to a read column address signal;

said signal generating means generates said inhibit state setting signal when at least two write bit line selecting means select write bit lines in the same bit line group;

said control means includes driving means for driving, when at least two write word line selecting means select write word lines in the same word line group, a word line selected by one of said at least two write word line selecting means in response to said inhibit state setting signal; and said driving means drives a write word line selected by a write word line selecting means which initiated selecting operation the earliest in response to said inhibit state setting signal, when at least two write word line selecting means selects write word lines within the same word line group.

* * * * *